(12) United States Patent
Watanabe et al.

(10) Patent No.: US 9,966,500 B2
(45) Date of Patent: May 8, 2018

(54) SEMICONDUCTOR OPTICAL DEVICE AND DISPLAY DEVICE

(71) Applicant: SONY CORPORATION, Tokyo (JP)

(72) Inventors: Yoshiaki Watanabe, Kanagawa (JP); Takayuki Kawasumi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days. days.

(21) Appl. No.: 15/304,605

(22) PCT Filed: Mar. 20, 2015

(86) PCT No.: PCT/JP2015/058441
§ 371 (c)(1),
(2) Date: Oct. 17, 2016

(87) PCT Pub. No.: WO2015/163057
PCT Pub. Date: Oct. 29, 2015

(65) Prior Publication Data
US 2017/0047480 A1    Feb. 16, 2017

(30) Foreign Application Priority Data

Apr. 25, 2014 (JP) .................. 2014-090936

(51) Int. Cl.
*H01L 33/14* (2010.01)
*H01L 33/30* (2010.01)
(Continued)

(52) U.S. Cl.
CPC .......... *H01L 33/14* (2013.01); *H01L 33/0045* (2013.01); *H01L 33/30* (2013.01); *H01L 33/325* (2013.01); *H01S 5/1237* (2013.01); *H01S 5/2054* (2013.01); *H01S 5/2063* (2013.01); *H01S 5/22* (2013.01); *H01S 5/34333* (2013.01); *H01S 2301/166* (2013.01)

(58) Field of Classification Search
CPC ..... H01L 33/14; H01L 33/0045; H01L 33/30; H01L 33/325; H01S 5/1237; H01S 5/2054; H01S 5/2063; H01S 5/22; H01S 5/34333
See application file for complete search history.

(56) References Cited

U.S. PATENT DOCUMENTS

2013/0001588 A1* 1/2013 Fukuda ............... H01L 33/20
257/76

FOREIGN PATENT DOCUMENTS

| JP | 02-310975 A | 12/1990 |
| JP | 08-250763 A | 9/1996 |
| JP | 09-237914 A | 9/1997 |

* cited by examiner

*Primary Examiner* — Armando Rodriguez
(74) *Attorney, Agent, or Firm* — Chip Law Group

(57) ABSTRACT

A semiconductor optical device includes: a ridge stripe structure portion 20 in which a first compound semiconductor layer 31, an active layer 32, and a second compound semiconductor layer 32 are stacked and which has a first end surface 21 which emits light and a second end surface 22 opposite to the first end surface 21; and a current regulation region 41 provided to be adjacent to at least one of ridge stripe adjacent portions 40 positioned at both sides of the ridge stripe structure portion 20, at the second end surface side, and to be away from the ridge stripe structure portion 20. A bottom surface of the current regulation region 41 is under the active layer 33, and a top surface of the ridge stripe adjacent portion 40 excluding the current regulation region 41 is above the active layer 33.

13 Claims, 15 Drawing Sheets

(51) Int. Cl.
 *H01L 33/00* (2010.01)
 *H01L 33/32* (2010.01)
 *H01S 5/22* (2006.01)
 *H01S 5/343* (2006.01)
 *H01S 5/12* (2006.01)
 *H01S 5/20* (2006.01)

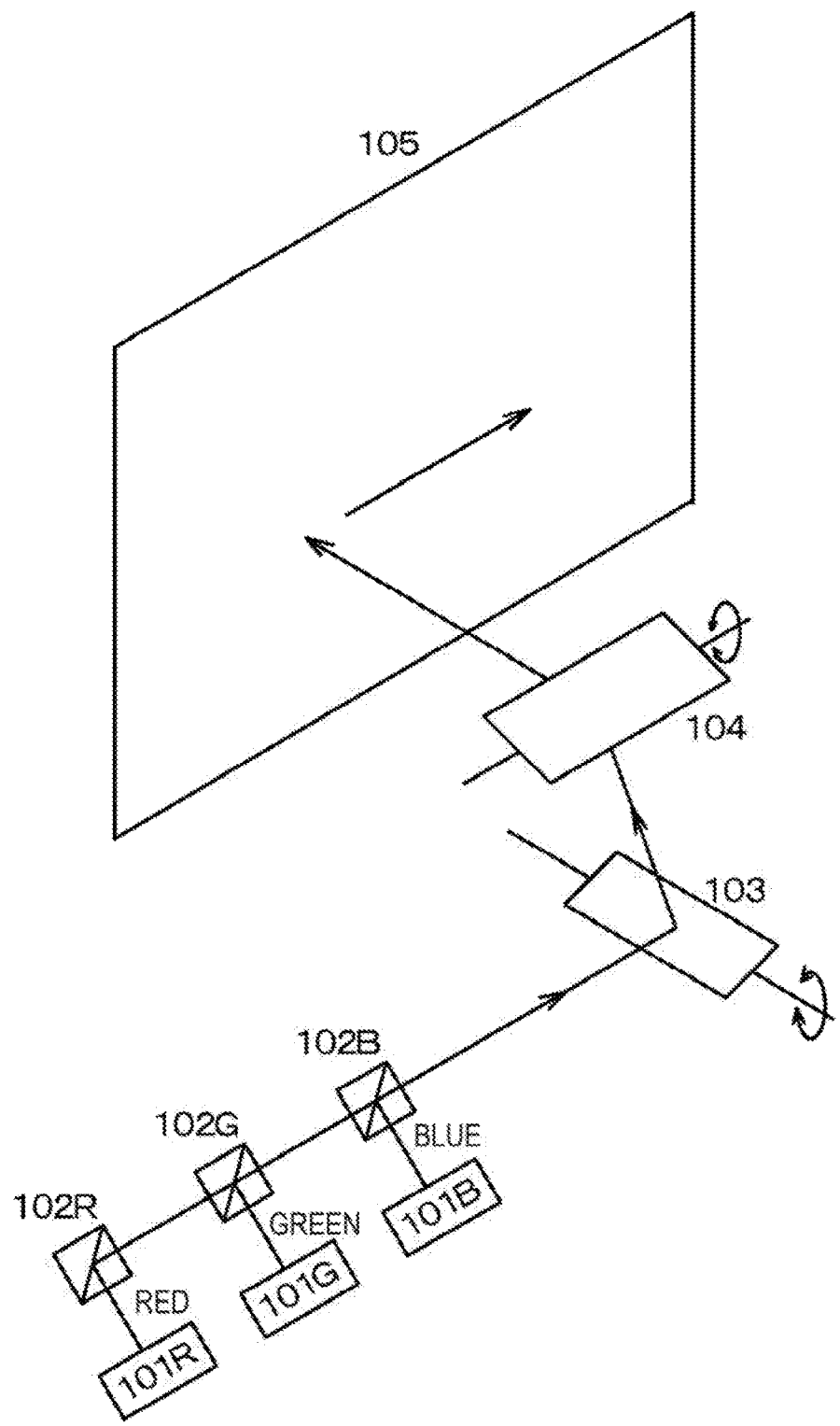

SEMICONDUCTOR OPTICAL DEVICE AND DISPLAY DEVICE

CROSS REFERENCE TO RELATED APPLICATIONS

This application is a U.S. National Phase of International Patent Application No. PCT/JP2015/058441 filed on Mar. 20, 2015, which claims priority benefit of Japanese Patent Application No. JP 2014-090936 filed in the Japan Patent Office on Apr. 25, 2014. Each of the above-referenced applications is hereby incorporated herein by reference in its entirety.

TECHNICAL FIELD

The present disclosure relates to a semiconductor optical device and a display device.

BACKGROUND ART

Super luminescent diodes (SLDs) having structures similar to those of semiconductor laser elements have a broad light emission spectrum close to that of light emitting diodes (LEDs) and can emit light at narrow emission angles and with high light intensities equivalent to the semiconductor laser elements. Also, super luminescent diodes have been applied in the field of interferometers such as optical gyroscopes in the related art, but have recently been receiving attention in an application to display devices as light sources for forming images having little interference noise (speckle noise) because of their low coherence.

For example, a waveguide is formed to be bent in the middle thereof so that reflection from an end surface is remarkably suppressed, or oscillation of a laser mode is suppressed to realize a low coherent light source using a subminiature short resonator in super luminescent diodes disclosed in, for example, JP H2-310975A. In other words, an amplified state is acquired by passing light through a waveguide only in one direction thereof rather than resonance occurring because of reciprocation of light between two end surface mirrors like semiconductor laser elements. A generation source of light is spontaneously emitted light generated from a portion of an active layer, and the spontaneously emitted light having a wide light emission spectrum width is directly amplified and is emitted to the outside.

CITATION LIST

Patent Literature

Patent Literature 1: JP H2-310975A

SUMMARY OF INVENTION

Technical Problem

Here, applying much current or lengthening a waveguide length to be as long as possible can be considered for the purpose of acquiring a large light output in a semiconductor optical device. However, when much current is applied, an upper limit of the applied current is defined based on heat saturation of the semiconductor optical device. Therefore, a heat dissipation burden of mounting/packaging is increased to acquire a high light output, which is a cause of high cost and is actually likely to generate laser oscillation even with respect to slight end surface reflection. Thus, a significantly lower current than the upper limit based on the heat saturation should be applied. Also, when a waveguide is lengthened, light undergoes many amplification actions in a longer path until the light is emitted to the outside. Thus, a light intensity is accordingly increased. However, the light undergoes more amplification in accordance with stimulated emission in the waveguide so that the light is affected by a gain spectrum. Therefore, as a light amplification region is longer, a light emission spectrum width is narrowed, which impairs low coherence. Also, a size of the semiconductor optical device is increased, which is not suitable for reducing a package, the entire waveguide loss is increased, and the entire efficiency is thus reduced.

Accordingly, an object of the present disclosure is to provide a semiconductor optical device which maintains low coherence and has a configuration and a structure capable of acquiring a high light output and a display device including such a semiconductor optical device.

Solution to Problem

A semiconductor optical device according to a first aspect or a second aspect of the present disclosure for achieving the above-described object includes: a ridge stripe structure portion in which a first compound semiconductor layer, an active layer made of a compound semiconductor, and a second compound semiconductor layer are stacked and which has a first end surface which emits light and a second end surface opposite to the first end surface; and a current regulation region provided to be adjacent to at least one of ridge stripe adjacent portions positioned at both sides of the ridge stripe structure portion, at the second end surface side, and to be away from the ridge stripe structure portion.

Also, in the semiconductor optical device related to the first aspect of the present disclosure, when a distance from a bottom surface of the first compound semiconductor layer to a bottom surface of the current regulation region is $H_1$, a distance from the bottom surface of the first compound semiconductor layer to a top surface of the ridge stripe adjacent portion excluding the current regulation region is $H_2$, a thickness of the first compound semiconductor layer is $T_1$, a thickness of the active layer is $T_3$, and a thickness of the second compound semiconductor layer is $T_2$, the following expressions are satisfied:

$$H_1 \leq T_1 \quad (1)$$

and $$T_1 + T_3 \leq H_2 \leq T_1 + T_3 + T_2 \quad (2).$$

In other words, the bottom surface of the current regulation region is under the active layer, and the top surface of the ridge stripe adjacent portion excluding the current regulation region is above the active layer. Here, when a value of $H_1$ toward the top surface of the ridge stripe adjacent portion is set to be positive, $H_1$ may be a positive or negative value or 0.

In the semiconductor optical device according to the second aspect of the present disclosure, the current regulation region prevents a leakage current from flowing from the ridge stripe structure portion.

A display device of the present disclosure for achieving the above-described object includes the semiconductor optical device related to the first aspect or the second aspect of the present disclosure.

Advantageous Effects of Invention

Since a light intensity which contributes to light emission is remarkably low in a spontaneously emitted light generation region serving as a generation source of light in the ridge stripe structure portion, carriers are generally consumed less in the active layer. For this reason, carriers injected into the active layer escape toward the ridge stripe adjacent portion. In the semiconductor optical device related to the first aspect of the present disclosure, the current regulation region satisfies the foregoing equation (1), and the ridge stripe adjacent portion excluding the current regulation region satisfies the foregoing expression (2). Also, in the semiconductor optical device related to the second aspect of the present disclosure, the current regulation region prevents a leakage current from flowing from the ridge stripe structure portion. In other words, a leakage current from a spontaneously emitted light generation region serving as a generation source of light in the ridge stripe structure portion to the ridge stripe adjacent portion is suppressed. Therefore, carriers stay in and effectively act on the ridge stripe structure portion. As a result, an increase in carrier density, an increase in intensity of spontaneously emitted light, and an increase in the light emission spectrum width of the spontaneously emitted light can be accordingly achieved. Accordingly, an increase in light emission spectrum width in the semiconductor optical device, a decrease in speckle noise, and improvement in luminous efficiency can be achieved. Note that effects disclosed in the present specification are merely examples, and the present disclosure is not limited thereto. In addition, there may be additional effects.

BRIEF DESCRIPTION OF DRAWINGS

FIG. 8 is a conceptual diagram of a display device in Example 7.

DESCRIPTION OF EMBODIMENT(S)

Figure 1:
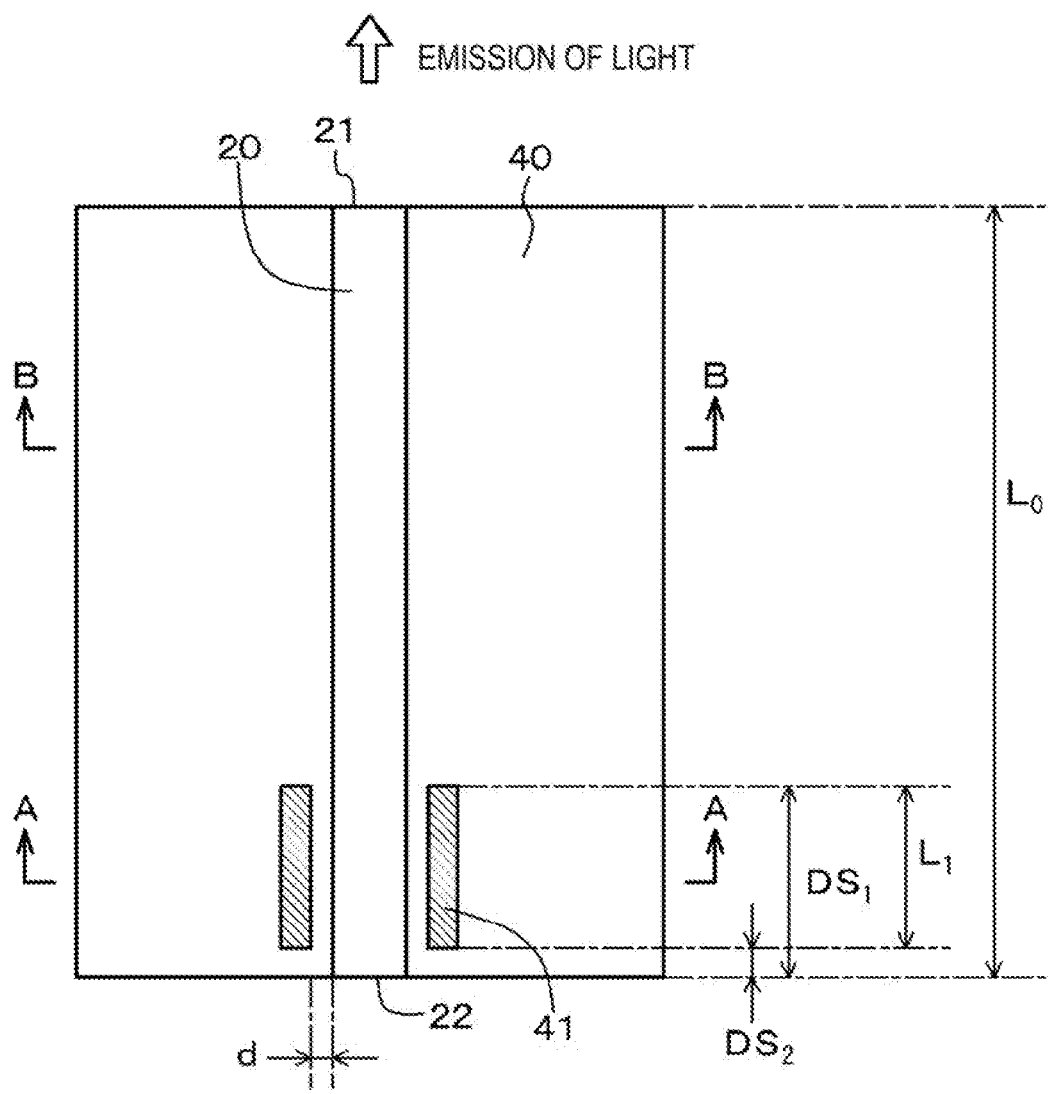
FIG. 1 is a schematic arrangement diagram of component elements of a semiconductor optical device of Example 1.

Hereinafter, the present disclosure will be described with reference to the appended drawings and based on examples. Here, the present disclosure is not limited to the examples, and various numerical values and materials in the examples are merely examples. Note that description will be provided in the following order.
1. Description related to the entire content of semiconductor optical devices related to a first aspect and a second aspect of the present disclosure and a display device of the present disclosure
2. Example 1 (semiconductor optical devices related to the first aspect and the second aspect of the present disclosure)
3. Example 2 (modification of Example 1)
4. Example 3 (another modification of Example 1)
5. Example 4 (yet another modification of Example 1)
6. Example 5 (yet another modification of Example 1)
7. Example 6 (yet another modification of Example 1)
8. Example 7 (a display device of the present disclosure), etc.

[Description Related to the Entire Content of Semiconductor Optical Devices Related to a First Aspect and a Second Aspect of the Present Disclosure and a Display Device of the Present Disclosure]

In a semiconductor optical device related to a first aspect or a second aspect of the present disclosure and a semiconductor optical device constituting a display device of the present disclosure (hereinafter, they are collectively referred to simply as "semiconductor optical devices of the present disclosure" in some cases), when a length of a ridge stripe structure portion is $L_0$ and a length of a current regulation region is $L_1$,
a shape in which $0.1 \leq L_1/L_0 < 1.0$, or preferably $0.1 \leq L_1/L_0 \leq 0.3$ is satisfied can be set.

In the semiconductor optical devices of the present disclosure including the above-described preferable shapes, when a distance from an end of a first end surface side of the current regulation region to a second end surface is $DS_1$ and a length of the ridge stripe structure portion is $L_0$,
a shape in which $DS_1/L_0 < 1.0$, or preferably $DS_1/L_0 \leq 0.3$ is satisfied can be set. In addition, when a distance from an end of a second end surface side of the current regulation region to the second end surface is $DS_2$, a shape in which $$DS_1/L_0 > DS_2/L_0 \geq 0$$

is satisfied can be set.

Note that a distance $H_1$ from a bottom surface of a first compound semiconductor layer to a bottom surface of the current regulation region, the length $L_1$ of the current regulation region, the distance $DS_1$ from the end of the first end surface side of the current regulation region to the second end surface, the distance $DS_2$ from the end of the second end surface side of the current regulation region to the second end surface, etc. may be adopted as long as they are determined based on, for example, light intensity distribution within a ridge stripe structure portion (within a waveguide) acquired through device simulation. Alternatively, the length $L_1$ and a position of the current regulation region may be adopted as long as they are determined based on a position of a spontaneously emitted light generation region serving as a generation source of light in the ridge stripe structure portion (the waveguide). A width of the current regulation region is not particularly limited and depends on a tolerance of a process, but is inherently arbitrary.

Also, in the semiconductor optical device (including the semiconductor optical device constituting the display device of the present disclosure) related to the first aspect of the present disclosure including the various preferred shapes described above, the current regulation region can be configured to have a shape in which a leakage current is prevented from flowing from the ridge stripe structure portion.

In the semiconductor optical device of the present disclosure including the various preferred shapes described above, the current regulation region can be constituted by a concave portion formed in the first compound semiconductor layer. In this case, the concave portion can be configured such that an insulating material (including a semi-insulating material) is embedded in the concave portion. An insulating material (including a semi-insulating material) is embedded in a concave portion near the waveguide so that an element capacity is reduced, electric matching with a driver is improved, and the driving of the semiconductor optical device can thus be improved during pulse driving, etc.

Alternatively, in the semiconductor optical device of the present disclosure including the various preferred shapes described above, the current regulation region can be constituted by a layer of a compound semiconductor on which ion implantation has been performed. Such a configuration is adopted so that preferred heat dissipation (heat dissipation characteristics) can be acquired. Here, an example of "the layer of the compound semiconductor on which the ion implantation has been performed" can include:
(1) a stacked structure of a portion in a thickness direction of the first compound semiconductor layer/an active layer/a portion of a thickness direction of a second compound semiconductor layer,
(2) a stacked structure of a portion in the thickness direction of the first compound semiconductor layer/an active layer, or
(3) a portion of the thickness direction of the first compound semiconductor layer. Ion species used to implant ions can include boron (B) and protons (H) when a compound semiconductor layer is made of a GaAs-based compound semiconductor, iron (Fe) when the compound semiconductor layer is made of an InP-based compound semiconductor, and iron (Fe) and boron (B) when the compound semiconductor layer is made of a GaN-based compound semiconductor. Note that, with regard to whether an ion implantation process has been performed, the presence of ions can be specified through analysis of SIMS, etc. and can also be detected by measuring electrical conductivity, polarity, a dielectric constant, etc. of a cross section of the semiconductor optical device using scanning spreading resistance microscopy (SSRM), scanning non-linear dielectric microscopy (SNDM), etc.

Alternatively, in the semiconductor optical device of the present disclosure including the various preferred shapes described above, the current regulation region can be constituted by the insulating layer (including the semi-insulating layer). The insulating layer is provided near the waveguide so that an element capacity is reduced, electric matching with a driver is improved, and the driving of the semiconductor optical device can thus be improved during pulse driving, etc.

Alternatively, in the semiconductor optical device of the present disclosure including the various preferred shapes described above, the current regulation region can be configured to have a stacked structure (a reverse pn stacked structure) of the compound semiconductor layers configured to prevent a current from flowing from the second compound semiconductor layer to the first compound semiconductor layer via the current regulation region. Such a configuration is adopted so that better heat dissipation (heat dissipation characteristics) than that when an insulating material is embedded can be acquired.

In addition, in the semiconductor optical device of the present disclosure including the various preferred shapes and configurations described above, the semiconductor optical device can be configured to constitute a super luminescent diode (SLD), a semiconductor laser element, or a semiconductor optical amplifier. Here, in a semiconductor laser element, a relationship between light reflectance in a first end surface and light reflectance in a second end surface is optimized so that a resonator is configured, and light is emitted from the first end surface. Alternatively, an external resonator may be disposed. On the other hand, in a super luminescent diode, light generated from an active layer is emitted from a first end surface without a resonator being configured by setting light reflectance in the first end surface to have a remarkably low value and setting light reflectance in a second end surface to have a remarkably high value. The first end surface is formed with a non-reflective coating layer (AR) or a low-reflection coating layer, and the second end surface is formed with a high-reflection coating layer (HR). Also, light incident from a second end surface in a semiconductor optical amplifier is amplified and is emitted from a first end surface without a resonator being configured by setting light reflectance in the first end surface and the second end surface to have remarkably low values. The first end surface and the second end surface are formed with a non-reflective coating layer (AR) or a low-reflection coating layer. Examples of the non-reflective coating layer (the low-reflection coating layer) and the high-reflection coating layer can include a stacked structure of at least two types of layers selected from the group consisting of a titanium oxide layer, a tantalum oxide layer, a zirconium oxide layer, a silicon oxide layer, an aluminum oxide layer, an aluminum nitride layer, and a silicon nitride layer and can be formed based on a PVD method such as a sputtering method and a vacuum evaporation method.

If a width of the ridge stripe structure portion becomes too wide when the semiconductor laser element is configured by the semiconductor optical device, a higher-order transverse mode may occur. Thus, setting the width of the ridge stripe structure portion to have a value in which the higher-order transverse mode does not occur is preferable. To be specific, an example of the width of the ridge stripe structure portion can include, for example, 1.0 µm to 3.0 µm.

In the semiconductor optical device including the various preferred shapes and configurations described above (hereinafter, they are collectively referred to simply as "semiconductor optical devices of the present disclosure, etc." in some cases), any current regulation region which is provided at at least one of ridge stripe adjacent portions may be adopted, and providing current regulation regions at both sides is more preferable. An example of a planar shape of the current regulation region can include one belt-like shape (including a shape whose width is constant and a flared or tapered shape) which extends in a linear shape or a curved shape, can include a plurality of point-like (dot-like) shapes or a plurality of belt-like shapes arranged on a straight line or a curved line, and can have a heat dissipation fin shape. With regard to a distance (d) between the current regulation region and the ridge stripe structure portion, a distance which is as short as possible is preferable. However, the distance (d) may be determined in consideration of processing accuracy of the current regulation region and the ridge stripe structure portion, damage occurrence when the current regulation region is formed, damage occurrence when ions are implanted, overlapping with a region through which light passes, etc. In addition, the distance is not limited to the distance (d), but can include 1 µm to 3 µm.

In a stacked structure body including the first compound semiconductor layer, an active layer, and the second compound semiconductor layer, for the purpose of convenience, a direction of the shortest straight line which connects a region of an active layer in a first end surface of the ridge stripe structure portion and a region of an active layer of a second end surface is set as an X direction, i.e., a width direction of the active layer, a direction included in the first end surface is set as a Y direction, and a thickness direction of the active layer is set as a Z direction. Also, when the stacked structure body is assumed to be cut on an XY virtual plane, a shape of a region in which light is present (a region through which light passes) in the stacked structure body is, for example, an elliptical shape in the case of a single transverse mode (a single mode). Providing the current regulation region at a region in which the current regulation region overlaps the elliptical region as little as possible is preferable. On the other hand, providing the current regulation region at a region in which it overlaps a light intensity peak of the multiple transverse mode is preferable when assuming that an optical loss is intentionally introduced into the current regulation region in the case of a multiple transverse mode (a higher-order transverse mode and a multi-mode), and kink occurrence caused by a waveguide higher-order mode can thus be prevented.

Examples of compound semiconductors of the first compound semiconductor layer, the active layer, and the second compound semiconductor layer can include AlAs, AlAsP, AlAsSb, AlGaAs, AlGaAsP, AlGaAsSb, AlGaInAs, AlGaInP, AlGaN, AlInAs, AlInAsP, AlInGaN, AlInP, AlN, AlP, GaAs, GaAsP, GaAsSb, GaInAs, GaInAsP, GaInP, GaN, GaNAs, GaP, GaSb, InGaN, InN, and InP. Examples of methods of forming these layers (a film formation method) can include metal organic chemical vapor deposition methods (MOCVD methods and MOVPE methods), metal organic molecular beam epitaxy methods (MOMBE methods), hydride vapor phase epitaxy methods (HVPE methods) in which a halogen contributes to transportation or a reaction, and plasma-assisted physical vapor deposition methods (a PPD method). Examples of methods of etching a stacked structure body constituted by the first compound semiconductor layer, the active layer, and the second compound semiconductor layer to form the ridge stripe structure portion from the stacked structure body can include a combination of a lithography technique and a wet etching technique and a combination of a lithography technique and a dry etching technique. A configuration itself of the stacked structure body can be a well-known configuration. The stacked structure body is formed on a substrate and has a structure in which the first compound semiconductor layer, the active layer, and the second compound semiconductor layer are stacked in order from the substrate side.

The active layer may be constituted by single compound semiconductor layers and have a single quantum well structure [a QW structure] or a multi-quantum well structure [an MQW structure].

For example, the stacked structure body constituted by the first compound semiconductor layer, the active layer, and the second compound semiconductor layer can be configured to have a shape constituted by an AlGaInP-based compound semiconductor. In this case, the active layer can be configured to have a shape constituted by a quantum well structure in which a well layer constituted as a GaInP layer or an AlGaInP layer and a barrier layer constituted as an AlGaInP layer with a different composition are stacked. Alternatively, for example, the stacked structure body can be configured to have a shape constituted by an AlInGaN-based compound semiconductor having GaN and AlGaN. In this case, the active layer can be configured to have a shape constituted by a quantum well structure in which a well layer constituted as an AlInGaN layer and a barrier layer constituted as an AlInGaN layer with a different In composition are stacked. Here, the present disclosure is not limited to these configurations and structures.

The first compound semiconductor layer has a first conductivity type, and the second compound semiconductor layer has a second conductivity type different from the first conductivity type. Impurities may be introduced into the first compound semiconductor layer and the second compound semiconductor layer to cause the first compound semiconductor layer and the second compound semiconductor layer to have the first conductivity type and the second conductivity type, respectively. Examples of n-type impurities added to the compound semiconductor layers can include, for example, silicon (Si), sulfur (S), selenium (Se), germanium (Ge), tellurium (Te), tin (Sn), carbon (C), titanium (Ti), oxygen (O), and palladium (Pd), and examples of p-type impurities can include zinc (Zn), magnesium (Mg), carbon (C), beryllium (Be), cadmium (Cd), calcium (Ca), and barium (Ba).

An example of the substrate can include an AlGaInN substrate, an AlGaInP substrate, an AlGaN substrate, an AlGaP substrate, an AlInN substrate, an AlInP substrate, an AlN substrate, an AlP substrate, a GaAs substrate, a GaInN substrate, a GaInP substrate, a GaN substrate, a GaP substrate, a Ge substrate, an InN substrate, an InP substrate, a LiMgO substrate, a LiGaO$_2$ substrate, a MgAl$_2$O$_4$ substrate, a Si substrate, a SiC substrate, a ZnS substrate, a ZnO substrate, an alumina substrate, and a sapphire substrate. Also, substrates in which an underlying layer, a buffer layer, and an intermediate layer are formed on surfaces (main surfaces) of these substrates can also be used as a substrate. With regard to the main surfaces of these substrates, a crystal orientation plane called an A surface, a B surface, a C surface, an R surface, an M surface, an N surface, an S surface, etc., a surface in which these surfaces are off in a specific direction, etc. can be used according to a crystal structure (for example, a cubic type, a hexagonal type, etc.).

Examples of an insulating material or a material constituting an insulating layer can include a $SiO_X$-based material such as $SiO_2$, a $SiN_Y$-based material, a $SiO_XN_Y$-based material, $Ta_2O_5$, $ZrO_2$, AlN, and $Al_2O_3$. An example of a method of embedding an insulating material in a concave portion or a method of forming an insulating layer can include, for example, a PVD method such as a vacuum deposition method and a sputtering method or a CVD method. It is preferable that an insulating material or a material constituting an insulating layer has thermal conductivity higher than thermal conductivity of a compound semiconductor constituting the first compound semiconductor layer in view of acquiring preferred heat dissipation (heat dissipation characteristics). To be specific, for example, usage of a material having high thermal conductivity such as AlN or a $SiN_Y$-based material for an insulating material or an insulating layer is preferable. Also, an example of a semi-insulating material or a material constituting a semi-insulating layer can include a low-doped semiconductor material and a semi-insulating semiconductor (semi-insulating through doping).

The ridge stripe structure portion in the semiconductor optical device, etc. of the present disclosure can be configured to have a shape which extends in a linear shape, can be configured to have a shape which extends in a state in which a plurality of lines are combined, and can be configured to have a shape which extends in a curved shape. Also, the ridge stripe structure portion may extend at a constant width and have a so-called flared structure (including a structure which extends in a tapered shape). An axis of the ridge stripe structure portion may be perpendicular to a first end surface and a second end surface, intersect the first end surface at a predetermined angle, and intersect the second end surface at a predetermined angle.

In addition, about several nm or more is preferable in full width at half maximum of an emitted light spectrum of light emitted from the first end surface of the semiconductor optical device, etc. of the present disclosure including the various preferred shapes and configurations described above.

The first compound semiconductor layer is electrically connected to a first electrode, and a second electrode is formed on the second compound semiconductor layer. For example, when the second electrode is formed on the second compound semiconductor layer having a p-type conductivity type, an example of such a second electrode (a p-side electrode) can include Au/AuZn, Au/Pt/Ti(/Au)/AuZn, Au/AuPd, Au/Pt/Ti(/Au)/AuPd, Au/Pt/TiW(/Ti)(/Au)/AuPd, Au/Pt/Ti, and Au/Ti. Also, for example, when the first electrode is formed on the first compound semiconductor layer having an n-type conductivity type or a substrate, an example of such a first electrode (an n-side electrode) can include Au/Ni/AuGe, Au/Pt/Ti(/Au)/Ni/AuGe, and Au/Pt/TiW(/Ti)/Ni/AuGe. Note that, the more times the symbol "/" follows a layer the more electrically separated the layer is from the active layer. The first electrode is electrically connected to the first compound semiconductor layer, but a shape in which the first electrode is formed on the first compound semiconductor layer and a shape in which the first electrode is connected to the first compound semiconductor layer via a conductive material layer or a conductive substrate are provided. The first electrode and the second electrode can be formed using various PVD methods such as, for example, a vacuum deposition method and a sputtering method. Pad electrodes may be provided on the first electrode and the second electrode to be electrically connected to external electrodes or circuits. The pad electrodes preferably have a single layer configuration or a multi-layer configuration including at least one type of metal selected from the group consisting of Ti (titanium), aluminum (Al), Pt (platinum), Au (gold), and Ni (nickel). Alternatively, the pad electrodes can also have a multi-layer configuration, examples of which include a multi-layer configuration of Ti/Pt/Au and a multi-layer configuration of Ti/Au.

When the second electrode is formed on the second compound semiconductor layer having a p-type conductivity type, a transparent conductive material layer may be formed between the second electrode and the second compound semiconductor layer. An example of a transparent conductive material constituting the transparent conductive material layer can include an indium tin oxide (including indium tin oxide (ITO), Sn-doped $In_2O_3$, crystalline ITO, and amorphous ITO), indium zinc oxide (IZO), IFO (F-doped $In_2O_3$), zinc oxide ($SnO_2$), ATO (Sb-doped $SnO_2$), FTO (F-doped $SnO_2$), or a zinc oxide (including ZnO, Al-doped ZnO, and B-doped ZnO).

An example of the display device of the present disclosure can include a projector device, an image display device, and a monitor device which include the semiconductor optical device related to the first aspect or the second aspect of the present disclosure as a light source, and a reflection type liquid crystal display device, a head-mounted display (HMD), a head-up display (HUD), and various illumination devices which include the semiconductor optical device related to the first aspect or the second aspect of the present disclosure as a light source. Also, the semiconductor optical device related to the first aspect or the second aspect of the present disclosure can be used as a light source of a microscope.

Example 1

Figure 2:
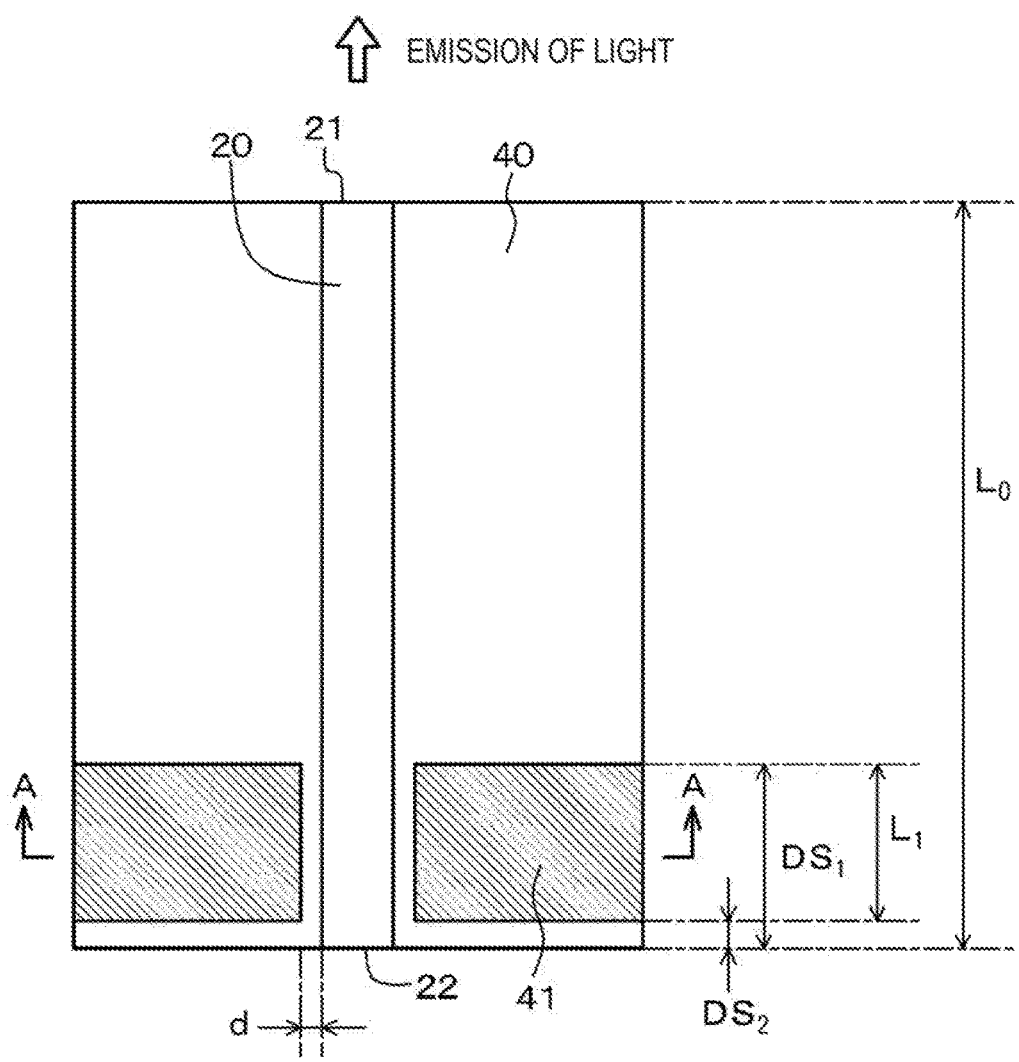
FIG. 2 is a schematic arrangement diagram of component elements of a semiconductor optical device of Example 3 or Example 5.
Figure 3A:
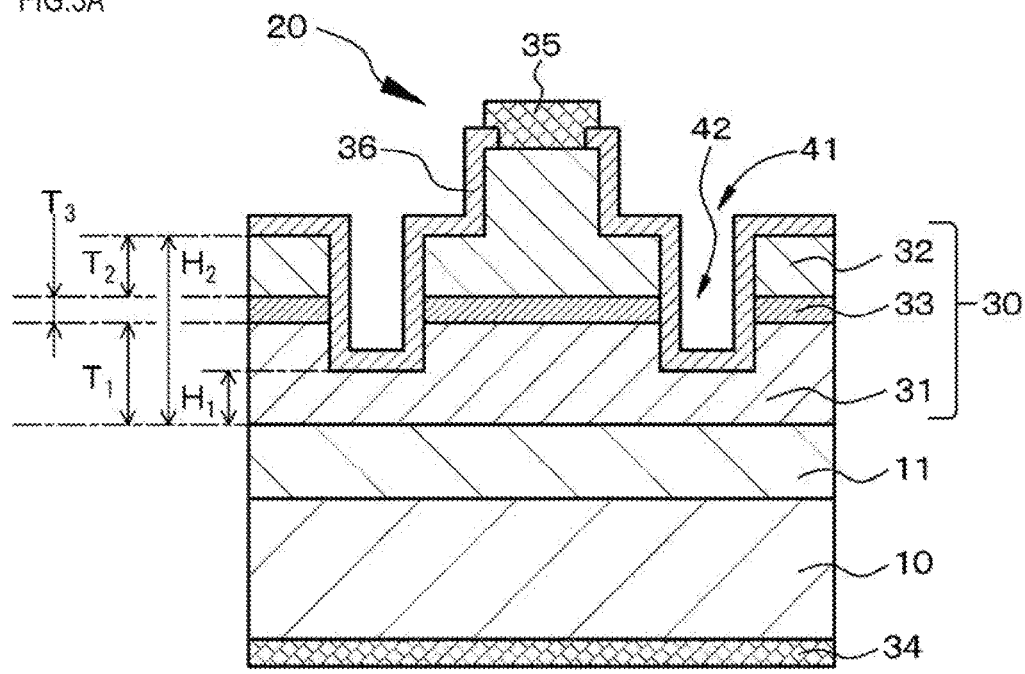
FIG. 3A and FIG. 3B are schematic end views of the semiconductor optical device of Example 1 along an arrow A-A and an arrow B-B in FIG. 1.
Figure 3B:
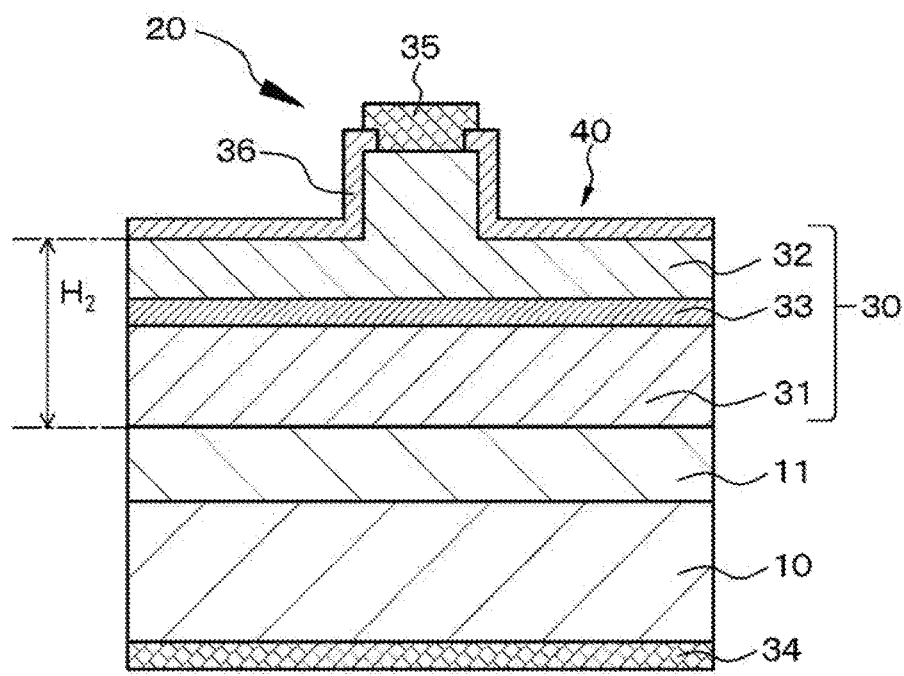

Example 1 relates to the semiconductor optical devices related to the first aspect and the second aspect of the present disclosure. FIG. 1 shows a schematic arrangement diagram of component elements of the semiconductor optical device of Example 1, FIG. 3A shows a schematic end view of the semiconductor optical device of Example 1 along an arrow A-A in FIG. 1, and FIG. 3B shows a schematic end view of the semiconductor optical device of Example 1 along an arrow B-B in FIG. 1. Note that the current regulation region is hatched with oblique lines to clarify the current regulation region in FIG. 1. Similarly, the current regulation region is also hatched with oblique lines to clarify the current regulation region in FIG. 2, FIG. 10A, FIG. 10B, FIG. 11A, FIG. 11B, FIG. 12, FIG. 13A, and FIG. 13B which will be described below.

The semiconductor optical devices of Example 1 or Example 2 to Example 6 which will be described below (specifically, a super luminescent diode (SLD)) include:

a ridge stripe structure portion 20 in which a first compound semiconductor layer 31, an active layer 33 made of a compound semiconductor, and a second compound semiconductor layer 32 are stacked, and which has a first end surface 21 configured to emit light and a second end surface 22 opposite to the first end surface 21, and a current regulation region 41 provided to be adjacent to at least one (both sides in the examples) of ridge stripe adjacent portions 40 positioned at both sides of the ridge stripe structure portion 20, at the second end surface side, and to be away from the ridge stripe structure portion 20.

The first end surface 21 is formed with a non-reflective coating layer (AR) or a low-reflection coating layer, and the second end surface 22 is formed with a high-reflection coating layer (HR), but these coating layers are omitted in the drawings.

When described on the basis of the semiconductor optical device related to the first aspect of the present disclosure, if a distance from a bottom surface of the first compound semiconductor layer 31 to a bottom surface of the current regulation region 41 is $H_1$, a distance from the bottom surface of the first compound semiconductor layer 31 to a top surface of the ridge stripe adjacent portion 40 excluding the current regulation region 41 is $H_2$, a thickness of the first compound semiconductor layer 31 is $T_1$, a thickness of the active layer 33 is $T_3$, and a thickness of the second compound semiconductor layer 32 is $T_2$, the following expressions are satisfied:

$$H_1 \leq T_1 \qquad (1) \text{ and}$$

$$T_1 + T_3 \leq H_2 \leq T_1 + T_3 + T_2 \qquad (2).$$

Alternatively, in other words, the bottom surface of the current regulation region 41 is under the active layer 33, and the top surface of the ridge stripe adjacent portion 40 excluding the current regulation region 41 is above the active layer 33. The bottom surface of the current regulation region 41 may be at the same position as or a lower position than the bottom surface of the first compound semiconductor layer 31. In other words, the following expression is satisfied:

$$(H_1 - T_1) \leq 0.$$

In other words, when the bottom surface of the first compound semiconductor layer 31 is assumed to be a reference and a value of $H_1$ toward the active layer is set to be positive, $H_1$ may be a positive or negative value or 0. When described on the basis of preferred aspects of the semiconductor optical device related to the second aspect of the present disclosure or the semiconductor optical device related to the first aspect of the present disclosure, the current regulation region 41 prevents a leakage current from flowing from the ridge stripe structure portion 20.

When a length of the ridge stripe structure portion 20 is $L_0$, and a length of the current regulation region 41 is $L_1$ in the semiconductor optical devices of Example 1 or Example 2 to Example 6 which will be described below, the following expression is satisfied:

$$0.1 \leq L_1/L_0 < 1.0.$$

Also, when a distance from an end of the first end surface 21 side of the current regulation region 41 to the second end surface 22 is $DS_1$, the following expression is satisfied:

$$DS_1/L_0 < 1.0.$$

When a distance from an end of the second end surface 22 side of the current regulation region 41 to the second end surface 22 is $DS_2$, the following expression is satisfied:

$$DS_2/L_0 \geq 0.$$

To be specific, the following expressions are set:

$$L_1/L_0 = 0.5$$

$$DS_1/L_0 = 0.5$$

$$DS_2/L_0 = 0.0.$$

Here, the current regulation region 41 in the semiconductor optical device of Example 1 is constituted by a concave portion 42 formed in the first compound semiconductor layer 31.

A stacked structure body 30 constituted by the first compound semiconductor layer 31 having an n-type conductivity type, the active layer 33, and the second compound semiconductor layer 32 having a p-type conductivity type in Example 1 is made of an AlGaInP-based compound semiconductor. An n-GaAs substrate is used as a substrate 10. The semiconductor optical device of Example 1 emits red. Here, the active layer 33 has a quantum well structure in which a well layer constituted as a GaInP layer or an AlGaInP layer and a barrier layer constituted as an AlGaInP layer having a different composition are stacked. A configuration of the stacked structure body 30 constituted by the GaInP-based compound semiconductor in the semiconductor optical device of Example 1 is shown in Table 1 below, but the compound semiconductor layer disclosed in the lowermost row is formed on the substrate 10. The active layer 33 has a multi-quantum well structure, and specifically, the barrier layer and the well layer are configured to have four layers and three layers, respectively. The same applies to Example 2 to Example 6 which will be described below.

TABLE 1

| Second compound semiconductor layer 32 | |
| --- | --- |
| Contact layer | p-GaAs: Zn-doped |
| Second cladding layer | p-AlInP: Zn-doped |
| Second guide layer | AlGaInP |
| Active layer 33 | |
| Well layer/barrier layer | GaInP/AlGaInP |
| First compound semiconductor layer 31 | |
| First guide layer | AlGaInP |
| First cladding layer | n-AlInP: Si-doped |
| Buffer layer 11 | n-GaInP |

Figure 15A:
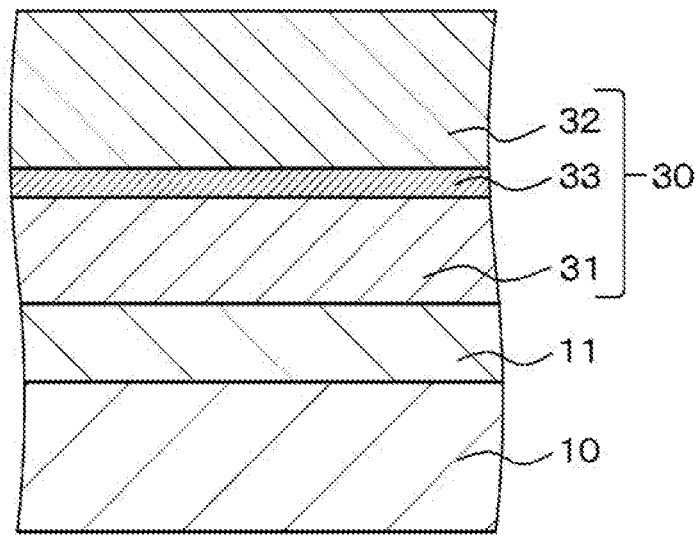
FIG. 15A and FIG. 15B are a schematic partial cross-sectional view and a partial end view of a substrate, etc. along the arrow B-B in FIG. 1 for describing a method of manufacturing the semiconductor optical device in Example 1.
Figure 15B:
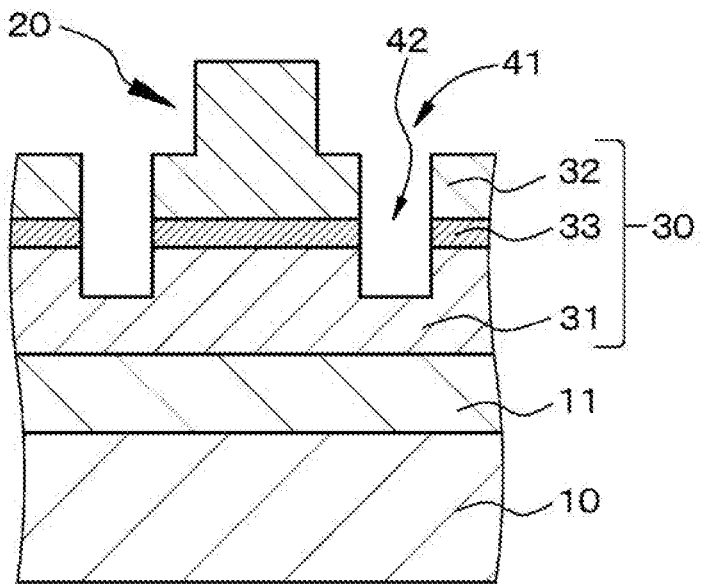

Hereinafter, a method of manufacturing the semiconductor optical device of Example 1 will be described with reference to FIG. 15A and FIG. 15B serving as a schematic partial cross-sectional view and a partial end view of the substrate, etc. along the arrow A-A of FIG. 1.

[Step-100]

The stacked structure body 30 including the active layer 33 is first formed on the substrate 10. To be specific, crystals of various compound semiconductor layers are grown using an MOCVD method, but in this case, for example, phosphine ($PH_3$), trimethyl gallium (TMG) gas or triethyl gallium (TEG) gas, trimethyl aluminum (TMA) gas, trimethyl indium (TMI) gas, monosilane gas ($SiH_4$ gas), and cyclopentadienyl magnesium gas may be used as a phosphorus raw material, a gallium raw material, an aluminum raw material, an In raw material, a silicon raw material, and an Mg source, respectively. To be more specific, the buffer layer 11, the first compound semiconductor layer 31, the active layer 33, and the second compound semiconductor layer 32 are epitaxially grown on a main surface of the substrate 10 formed as the n-GaAs substrate based on a general MOCVD method, that is, an MOCVD method using an organic metal and a hydrogen compound as a raw material. Thus, a structure shown in the schematic partial cross-sectional view of FIG. 15A can be acquired.

[Step-110]

Subsequently, the ridge stripe structure portion 20 with a constant width is formed, and the concave portion 42 is formed by etching a portion of the stacked structure body 30 based on a well-known photolithography technique and an etching technique. To be specific, a portion in a thickness direction of the second compound semiconductor layer 32 is removed by etching a predetermined portion in the thickness direction of the second compound semiconductor layer 32, and a portion in the thickness direction of the second compound semiconductor layer 32, the active layer 33, and the first compound semiconductor layer 31 is etched in a region in which the concave portion 42 is to be formed. Thus, the ridge stripe structure portion 20 and the concave portion 42 can be formed as shown in the schematic partial end view of FIG. 15B.

[Step-120]

Subsequently, an insulating film 36 made of $SiO_2$, SiN, or $Al_2O_3$ is formed on the entire surface based on a CVD method. Also, the insulating film 36 on the top surface of the second compound semiconductor layer 32 is removed using a photolithography technique and an etching technique, and a second electrode 35 is formed from the exposed top surface of the second compound semiconductor layer 32 to an upper portion of the insulating film 36 based on a lift-off method. The first electrode 34 is formed on a rear surface of the substrate 10 based on a well-known method. Thus, the semiconductor optical device of Example 1 can be acquired (refer to FIG. 1, FIG. 3A, and FIG. 3B).

An SLD having the same configuration and structure as Example 1 except that the current regulation region 41 was not provided was made as Comparative Example 1. Comparing the SLD of Example 1 with the SLD of Comparative Example 1, full width at half maximum of an emitted light spectrum of light emitted from the first end surface 21 of the SLD of Example 1 was three times that of the SLD of Comparative Example 1. An intensity of the emitted light in the SLD of Example 1 was 1.2 when an intensity of light of the SLD of Comparative Example 1 was set as "1." Note that, in this case, since there is a significant margin in a spectrum width, an output can be further increased using a cavity length, etc.

In the semiconductor optical device of Example 1, the current regulation region satisfies the foregoing expression (1), and the ridge stripe adjacent portion excluding the current regulation region satisfies the foregoing expression (2). Alternatively, the current regulation region prevents a leakage current from flowing from the ridge stripe structure portion. In other words, a current leakage (a leakage current) from a spontaneously emitted light generating region (a portion of the ridge stripe structure portion around the second end surface) serving as a generation source of light to the ridge stripe adjacent portion is suppressed. Therefore, carriers stay in and effectively act on the ridge stripe structure portion. As a result, an increase in carrier density, an increase in intensity of spontaneously emitted light, and an increase in the light emission spectrum width of the spontaneously emitted light can be accordingly achieved. Accordingly, an increase in light emission spectrum width in the semiconductor optical device, a decrease in speckle noise, a decrease in rising current, a decrease in threshold value current, driving with a low current, and improvement in luminous efficiency can be achieved. Also, since the current regulation region is formed away from a portion of intense light in the stacked structure body, the current regulation region does not serve as a factor which reduces reliability of the semiconductor optical device. Since starting-up of an optical output with respect to a current can be improved, and the semiconductor optical device can be operated even with a low current, an application range is widened. A structure of the active layer is optimized, and a wasteful current is also used to increase an optical output so that luminous efficiency when the optical output is increased can also be improved. In other words, carriers can be supplied to an amplification region based on diffusion from a region in which a carrier density is increased, and luminous efficiency can thus be improved. Also, since the light emission spectrum width can be widened, the ridge stripe structure portion can be lengthened, and the optical output can thus be greatly increased. On the other hand, since low coherency can be achieved through low current driving as long as acquiring a low optical output does not cause a problem, power consumption of the semiconductor optical device can be reduced, and efficiency of the semiconductor optical device can be increased.

Example 2

Figure 4A:
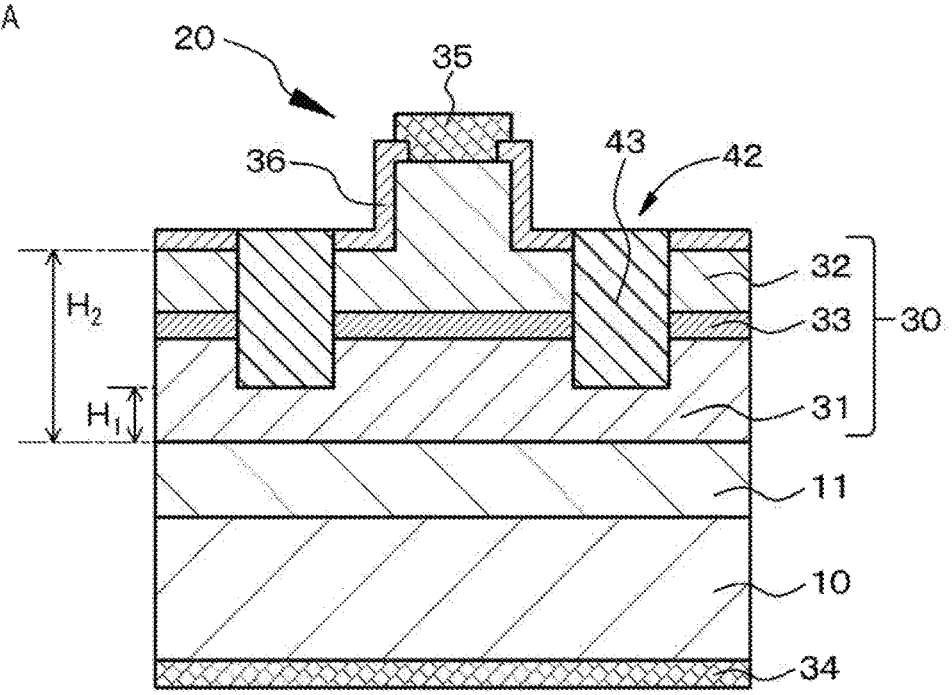
FIG. 4A is a schematic end view of a semiconductor optical device of Example 2 along the arrow A-A in FIG. 1.

Example 2 is a modification of Example 1. FIG. 4A shows a schematic end view of a semiconductor optical device of Example 2 along the arrow A-A of FIG. 1, but an insulating material 43 including AlN is embedded in the concave portion 42 in Example 2. Since, aside from these points, a configuration and a structure of the semiconductor optical device of Example 2 have the same configuration and structure as the semiconductor optical device of Example 1, the detailed description thereof is omitted.

In the semiconductor optical device of Example 2, formation of the concave portion 42 is omitted in [Step-110] of Example 1, the insulating material 43 including AlN may be embedded in the concave portion 42 based on a well-known method after the concave portion 42 is formed by removing a portion in the thickness direction of the second compound semiconductor layer 32, the active layer 33, and the first compound semiconductor layer 31, in which the concave portion 42 is to be formed, through etching after [Step-120].

Example 3

Figure 4B:
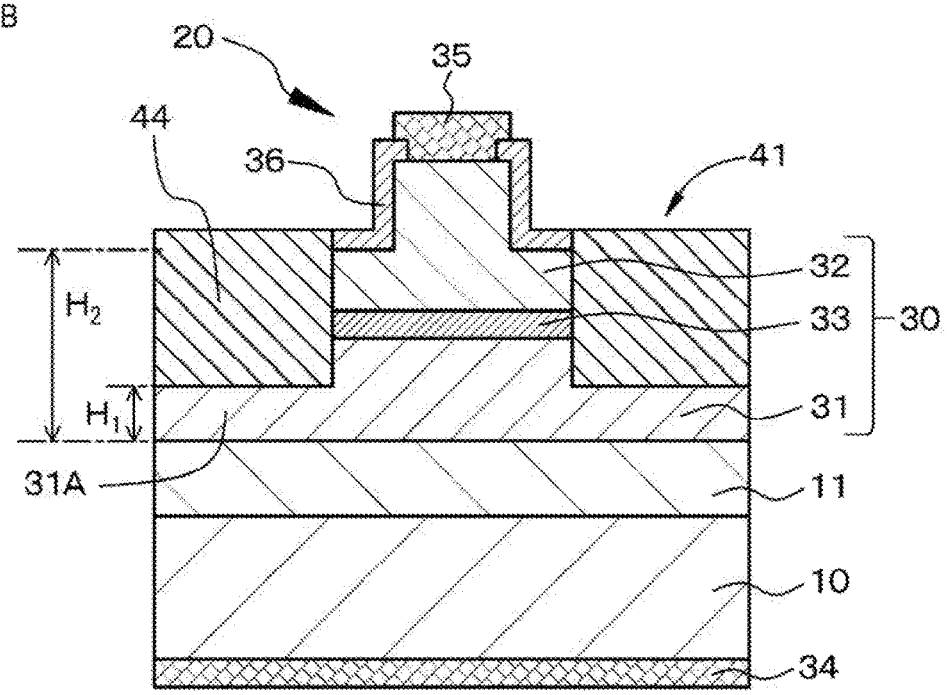
FIG. 4B is a schematic end view of the semiconductor optical device in Example 3 along an arrow A-A in FIG. 2.

Example 3 is also a modification of Example 1. FIG. 2 shows a schematic arrangement diagram of component elements of a semiconductor optical device of Example 3, and FIG. 4B shows a schematic end view of the semiconductor optical device of Example 3 along the arrow A-A of FIG. 2, but the current regulation region 41 is constituted by an insulating layer 44 made of AlN in the semiconductor optical device of Example 3. Since, aside from these points, a configuration and a structure of the semiconductor optical device of Example 3 are the same as the configuration and structure of the semiconductor optical device of Example 1, the detailed description thereof is omitted.

In the semiconductor optical device of Example 3 as well, formation of the concave portion 42 is omitted in [Step-110] of Example 1, the insulating layer 44 including AlN may be formed on a region 31A of the first compound semiconductor layer in which the current regulation region 41 is to be formed based on a well-known method after a portion in the thickness direction of the second compound semiconductor layer 32, the active layer 33, and the first compound semiconductor layer 31, in which the concave portion 42 is to be formed, is removed through etching after [Step-120].

Example 4

Figure 5A:
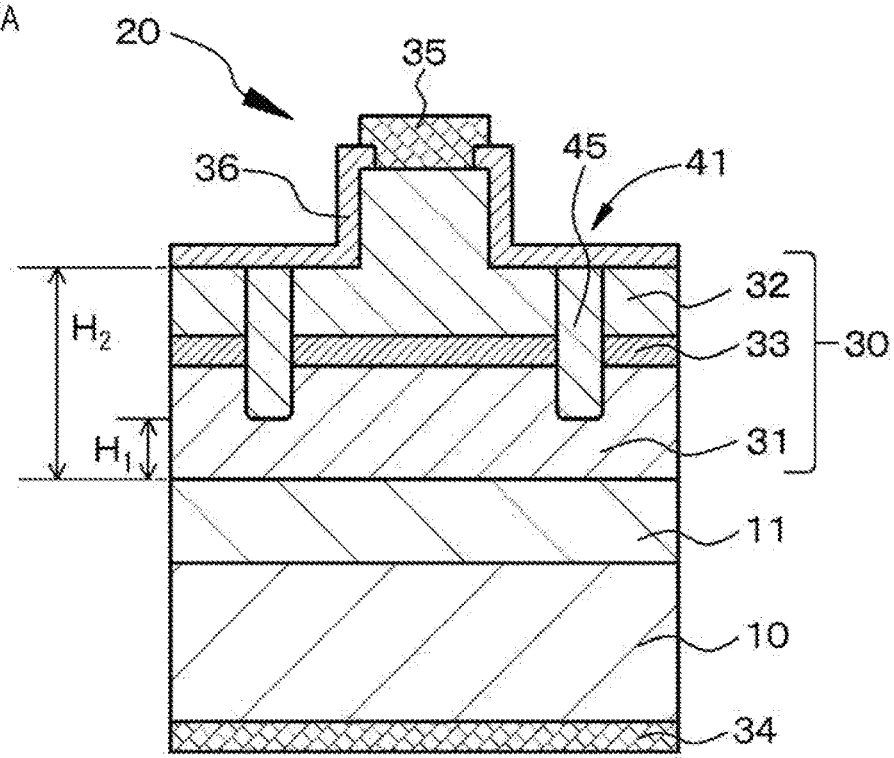
FIG. 5A and FIG. 5B are schematic end views of a semiconductor optical device in Example 4 along the arrow A-A in FIG. 1.
Figure 5B:
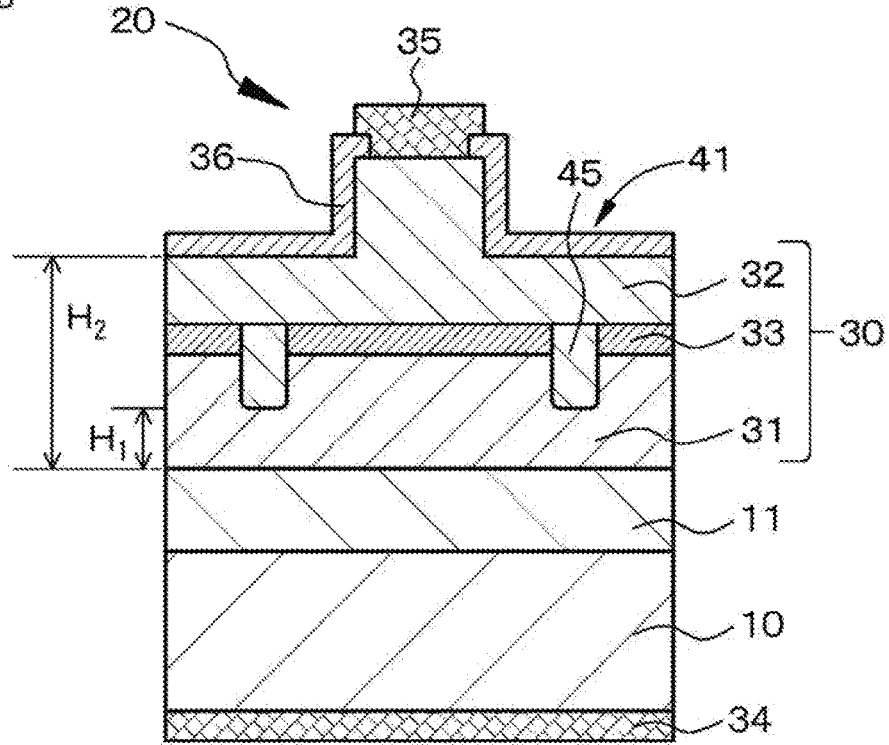

Example 4 is also a modification of Example 1. FIG. 5A and FIG. 5B show schematic end views of a semiconductor optical device of Example 4 along the arrow A-A of FIG. 1.

Here, the current regulation region 41 is constituted by a layer 45 made of a compound semiconductor on which ion implantation has been performed in the semiconductor optical device of Example 4. To be specific, the layer 45 made of the compound semiconductor on which the ion implantation has been performed is configured to have a stacked structure of a portion in the thickness direction of the first compound semiconductor layer 31/the active layer 33/a portion in the thickness direction of the second compound semiconductor layer 32 as shown in FIG. 5A or a stacked structure of a portion in the thickness direction of the first compound semiconductor layer 31/the active layer 33 as shown in FIG. 5B. Note that the layer 45 may be constituted by a portion in the thickness direction of the first compound semiconductor layer 31. Since the stacked structure body 30 is constituted by an InP-based compound semiconductor in Example 4, iron (Fe) is used as ion species. Since, aside from the above-described points, a configuration and a structure of the semiconductor optical device of Example 4 are the same as the configuration and structure of the semiconductor optical device of Example 1, the detailed description thereof is omitted.

In the semiconductor optical device of Example 4, formation of the concave portion 42 is omitted in [Step-110] of Example 1, and the current regulation region 41 can be acquired by performing ion implantation on a portion in the thickness direction of the second compound semiconductor layer 32, the active layer 33, and the first compound semiconductor layer 31, in which the current regulation region 41 is to be formed, performing ion implantation on a portion in the thickness direction of the active layer 33 and the first compound semiconductor layer 31, in which the current regulation region 41 is to be formed, or performing ion implantation on a portion in the thickness direction of the first compound semiconductor layer 31, in which the current regulation region 41 is to be formed, after [Step-120].

Example 5

Figure 6:
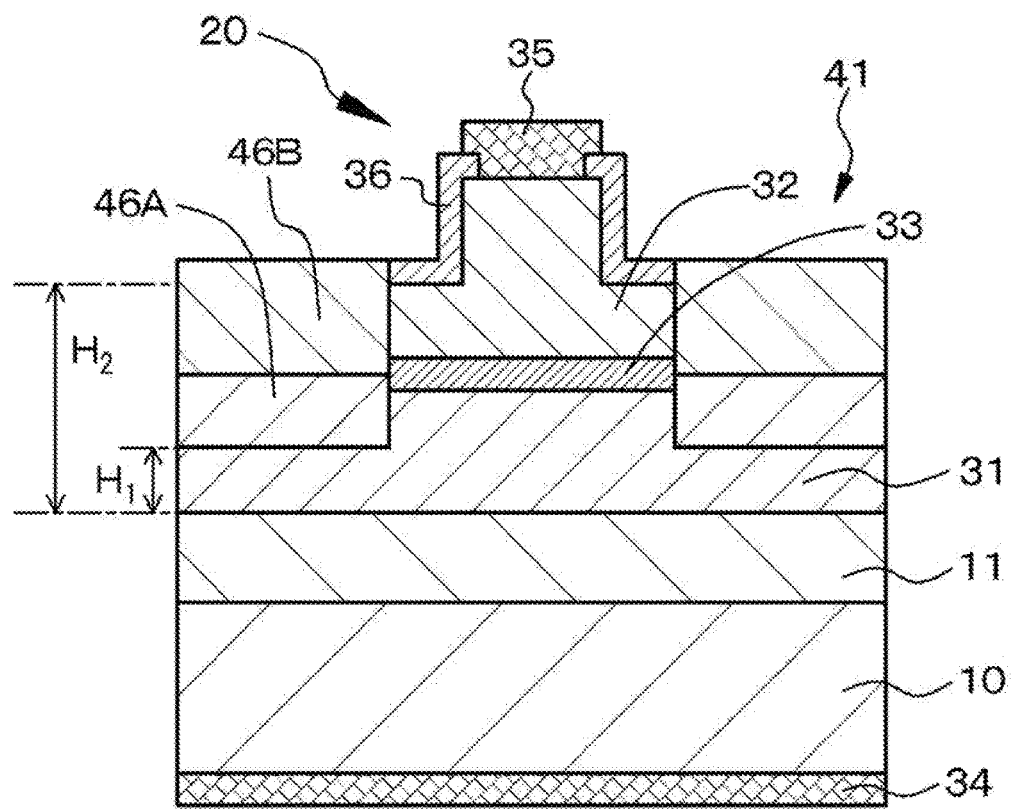
FIG. 6 is a schematic end view of the semiconductor optical device in Example 5 along the arrow A-A in FIG. 2.

Example 5 is also a modification of Example 1. FIG. 6 shows a schematic end view of a semiconductor optical device of Example 5 along the arrow A-A of FIG. 2. Here, the current regulation region 41 is configured to have a stacked structure (a reverse pn stacked structure) of compound semiconductor layers which prevents a current from flowing from the second compound semiconductor layer 32 to the first compound semiconductor layer 31 via the current regulation region 41 in the semiconductor optical device of Example 5. To be specific, the stacked structure includes a compound semiconductor layer 46A having a p-type conductivity type and a compound semiconductor layer 46B having an n-type conductivity type in order from below. The compound semiconductor layers 46A and 46B are constituted by a compound semiconductor of the same system as the compound semiconductor constituting the stacked structure body 30. An interface between the compound semiconductor layer 46A and the compound semiconductor layer 46B is positioned on a lateral surface of the active layer 33. With such a configuration, a current can be suppressed from the second compound semiconductor layer 32 to the first compound semiconductor layer 31 via the stacked structure. Since, aside from the above-described points, a configuration and a structure of the semiconductor optical device of Example 5 are the same as the configuration and structure of the semiconductor optical device of Example 1, the detailed description thereof is omitted.

Example 6

Figure 7A:
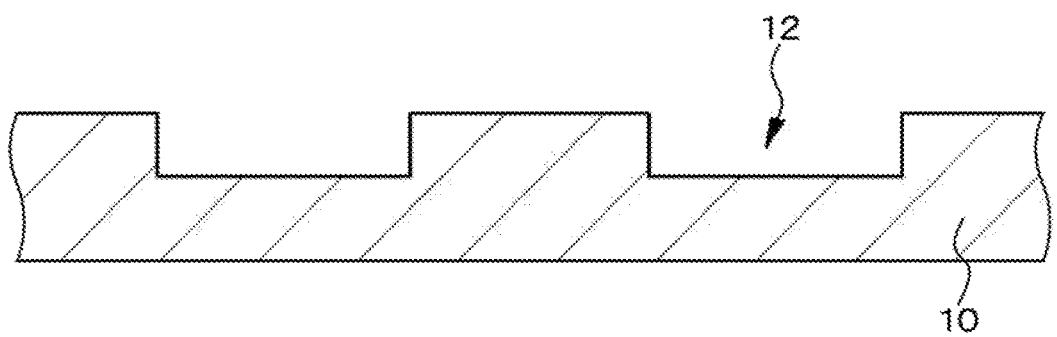
FIG. 7A, FIG. 7B, and FIG. 7C are schematic partial end views showing a manufacturing process of a semiconductor optical device in Example 6 along the arrow A-A in FIG. 1.
Figure 7B:
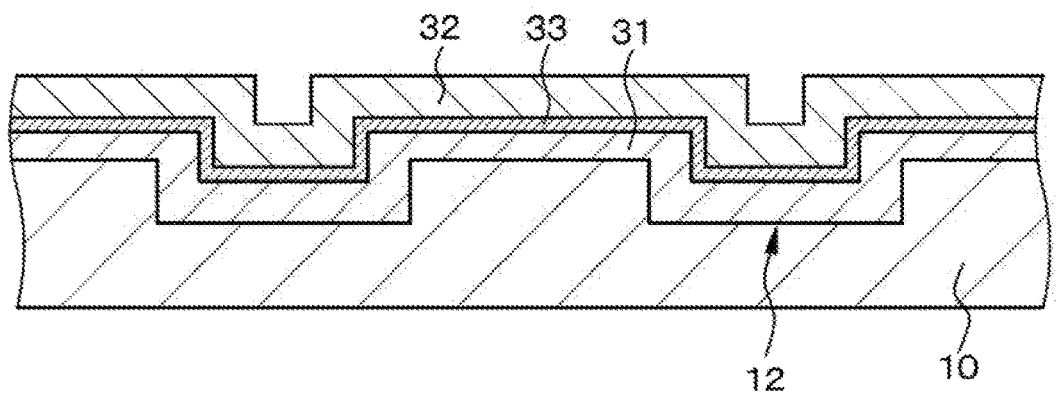
Figure 7C:
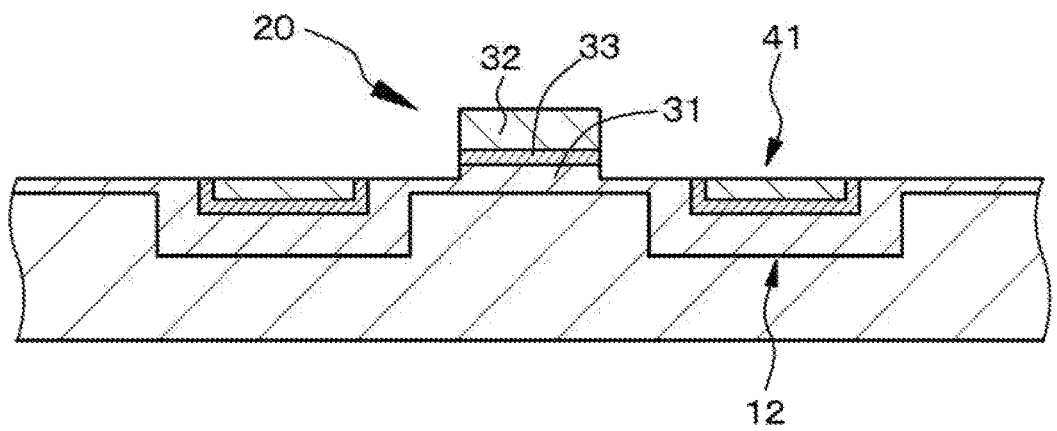

Example 6 is also a modification of Example 1. FIG. 7A, FIG. 7B, and FIG. 7C show schematic partial end views showing a manufacturing process of a semiconductor optical device of Example 6 along the arrow A-A of FIG. 1, but a concave portion 12 is formed in advance in a region of the substrate 10 in which the current regulation region 41 is to be formed in Example 6.

The substrate 10 in which the concave portion 12 is formed in advance in the region in which the current regulation region 41 is to be formed is prepared in manufacturing the semiconductor optical device of Example 6 (refer to FIG. 7A). Also, the stacked structure body 30 having the active layer 33 is formed on the substrate 10 as in [Step-100] of Example 1. Thus, a structure shown in the schematic partial cross-sectional view of FIG. 7B can be acquired. Note that the buffer layer 11 is not shown in FIG. 7A, FIG. 7B, and FIG. 7C. Subsequently, the ridge stripe structure portion 20 with a constant width is formed and the current regulation region 41 is formed by etching a portion of the stacked structure body 30 based on well-known photolithography and etching techniques as in [Step-110] of Example 1. Thus, a structure shown in the schematic partial cross-sectional view of FIG. 7C can be acquired. After that, the semiconductor optical device of Example 6 can be acquired by performing the same process as [Step-120] of Example 1.

Example 7

Example 7 relates to the display device of the present disclosure. The display device in Example 7 is assumed to be a projector device of a raster scan type having a semiconductor optical device as a light source as shown in a conceptual diagram of FIG. 8. The projector device raster-scans light using a semiconductor optical device constituted by an SLD as a light source, controls luminance of the light according to an image to be displayed, and thereby displays the image. To be specific, light from a semiconductor optical device 101R which emits red light, light from a semiconductor optical device 101G which emits green light, and light from a semiconductor optical device 101B which emits blue light are bundled into one light beam through dichroic prisms 102R, 102G and 102B. In addition, the light beam is scanned by a horizontal scanner 103 and a vertical scanner 104 and is projected onto a radiated surface 105, such as a screen or a wall surface, on which an image or a video is displayed so that the image can be acquired. The horizontal scanner 103 and the vertical scanner 104 can be, for example, a combination between a polygon mirror and a galvano scanner. Alternatively, the horizontal scanner and the vertical scanner can be, for example, a combination between a plurality of digital micro-mirror devices (DMDs) manufactured using an MEMS technique and a polygon mirror or a galvano scanner, can be configured to have a structure in which a horizontal scanner and a vertical scanner are integrally formed, that is, a two-dimensional spatial modulation element in which DMDs are arranged in a two-dimensional matrix form, and can be constituted by a two-dimensional MEMS scanner which performs a two-dimensional scan using one DMD. A refractive index modulation type scanner such as an acousto-optic effect scanner or an electro-optic effect scanner can also be used.

Figure 9:
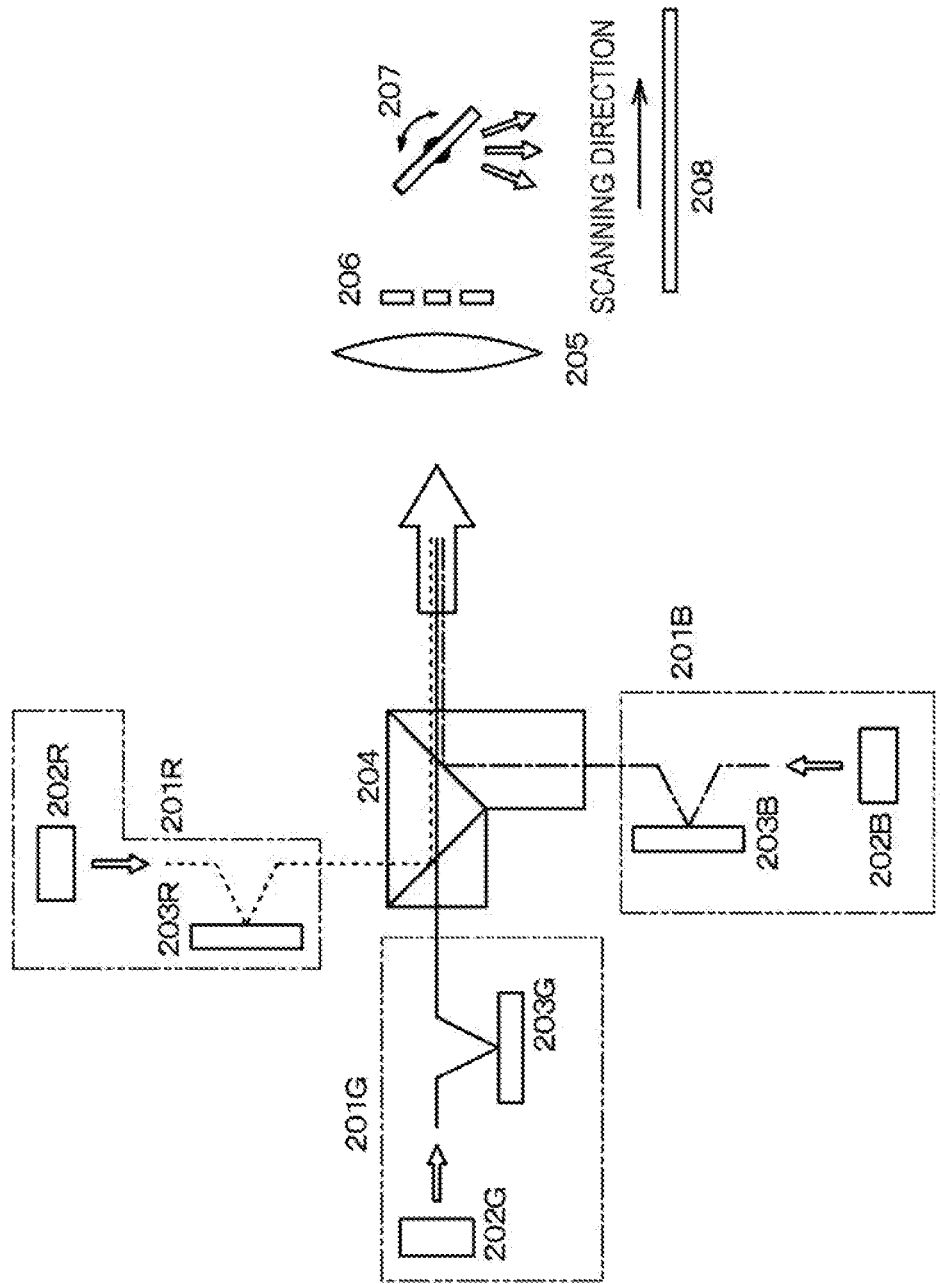
FIG. 9 is a conceptual diagram of another display device in Example 7.

Alternatively, a combination between a plurality of grating light valve (GLV) elements serving as a one-dimensional spatial modulation element and a polygon mirror or a galvano scanner can be exemplified. In other words, the display device includes an image generating device 201R constituted by a GLV element 203R and a light source (a semiconductor optical device which emits red light, SLD) 202R, an image generating device 201G constituted by a GLV element 203G and a light source (a semiconductor optical device which emits green light, SLD) 202G and an image generating device 201B constituted by a GLV element 203B and a light source (a semiconductor optical device which emits blue light, SLD) 202B as shown in a conceptual diagram of FIG. 9. Note that red light emitted from the light source (the semiconductor optical device which emits red light) 202R is indicated by a dotted line, green light emitted from the light source (the semiconductor optical device which emits green light) 202B is indicated by a solid line, and blue light emitted from the light source (the semiconductor optical device which emits blue light) 202B is indicated by a dashed-dotted line. The display device further includes a condensing lens (not shown) which condenses light emitted from the light sources 202R, 202G and 202B and causes the light to be incident on the GLV elements 203R, 203G and 203B, an L-shaped prism 204 on which the light emitted from the GLV elements 203R, 203G and 203B is incident and which bundles the light into one light flux, a lens 205 and a spatial filter 206 through which bundled light of the three primary colors passes, an imaging lens (not shown) which forms an image of one light flux which passes through the spatial filter 206, a scan mirror (a galvano scanner) 207 which scans one light flux which passes through the imaging lens, and a screen (a radiated surface) 208 onto which light scanned through the scan mirror 207 is projected.

The present disclosure has been described above based on the preferred examples, but the present disclosure is not limited to the examples. The configurations and the structures of the semiconductor optical devices and the display device described in the examples, and the methods of manufacturing the semiconductor optical devices are merely examples and can be appropriately changed. The same results can be acquired even if the active layer is constituted by a GaInN-based compound semiconductor represented in Table 2 below instead of the active layer constituted by the GaInP-based compound semiconductor. In other words, the stacked structure body is constituted by an AlInGaN-based compound semiconductor, and the active layer has a quantum well structure in which a well layer constituted as an AlInGaN layer and a barrier layer constituted as an AlInGaN layer having a different In composition are stacked. Note that a compound semiconductor layer disclosed in the lowermost row is formed on the substrate 10 formed as an n-GaN substrate. The semiconductor optical device of the composition shown in Table 2 emits blue or green. The current regulation regions are provided at both sides of the ridge stripe adjacent portion in the example, but the current regulation region may be provided only at one side of the ridge stripe adjacent portion. Also, the semiconductor optical device is constituted by a super luminescent diode (SLD) in the example, but a semiconductor laser element and a semiconductor optical amplifier can also be constituted by the stacked structure body 30 (refer to Table 1) described in Example 1. The semiconductor laser element and the semiconductor optical amplifier have the same configuration and structure as the SLD described in Example 1 except that the light reflectance of the first end surface 21 and the second end surface 22 is different from that of Example 1.

TABLE 2

| Second compound semiconductor layer 32 | |
|---|---|
| Contact layer | p-GaN: Mg-doped |
| Second cladding layer | p-AlGaN: Mg-doped |
| Second guide layer | p-AlGaN: Mg-doped |
| Active layer 33 | |
| Well layer/barrier layer | InGaN/GaN |
| First compound semiconductor layer 31 | |
| First guide layer | InGaN |
| First cladding layer | n-AlGaN: Si-doped |
| Buffer layer 11 | n-GaN |

Figure 12:
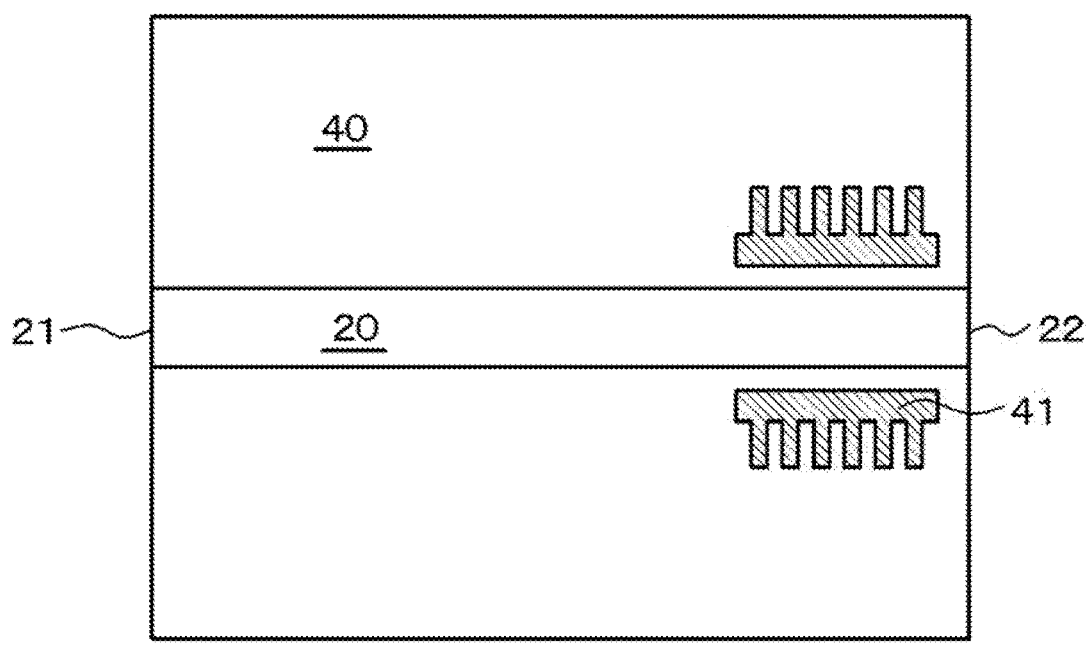
FIG. 12 is a schematic arrangement diagram of component elements of a semiconductor optical device for displaying a planar shape of a current regulation region.
Figure 13A:
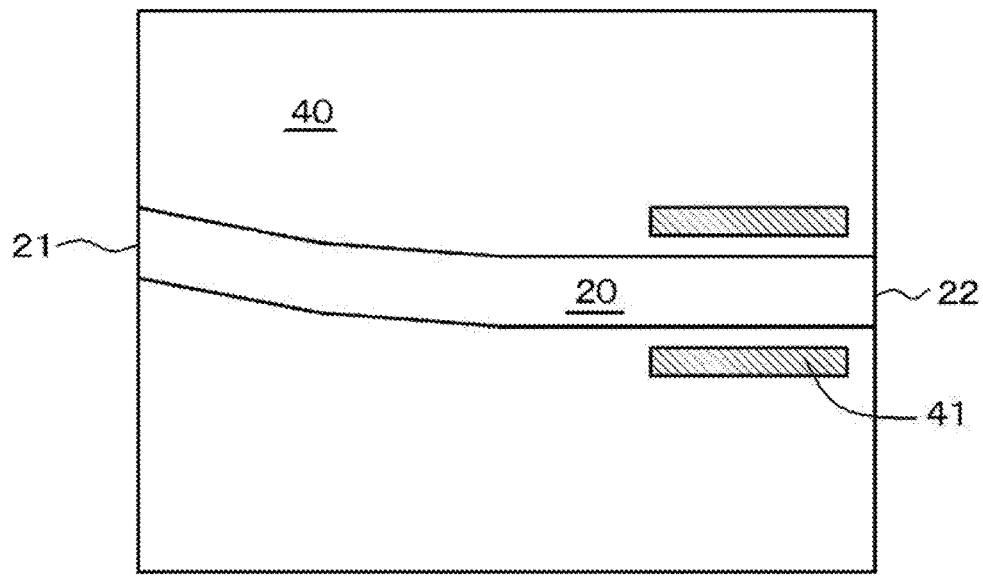
FIG. 13A and FIG. 13B are schematic arrangement diagrams of component elements of a semiconductor optical device for displaying a planar shape of a ridge stripe structure portion.
Figure 13B:
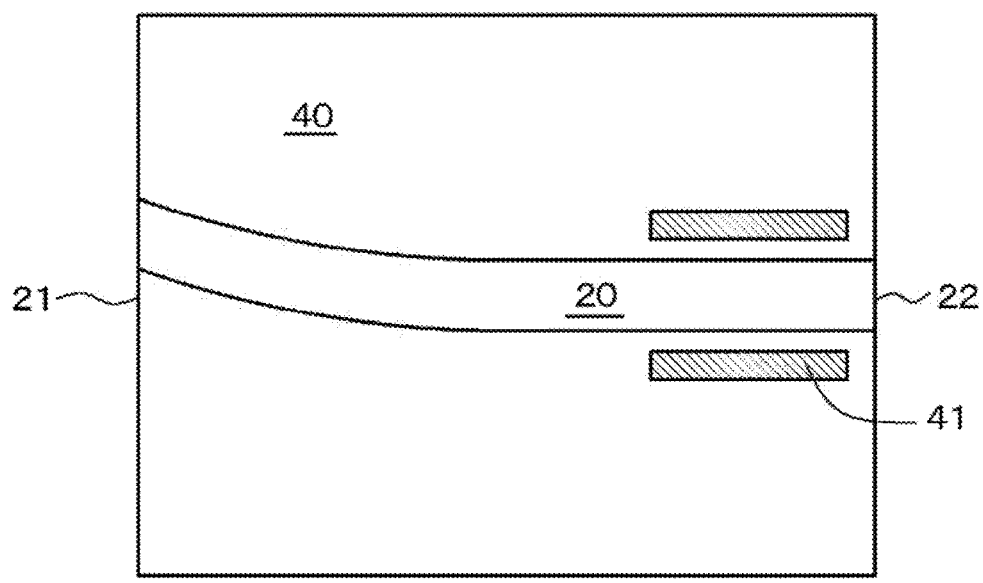

The planar shape of the current regulation region 41 is set to be one belt-like shape (a shape whose width is constant) which extends in a linear shape in the examples, but the planar shape of the current regulation region 41 is not limited thereto. Also, the ridge stripe structure portion 20 is set to be a shape which extends in a linear shape, but is not limited thereto. In addition, the ridge stripe structure portion 20 may extend at a constant width and have a so-called flared structure. FIG. 10A, FIG. 10B, FIG. 11A, FIG. 11B, and FIG. 12 show schematic arrangement diagrams of the configuration elements of the semiconductor optical device for showing the planar shape of the current regulation region, and FIG. 13A and FIG. 13B show schematic arrangement diagrams of the configuration elements of the semiconductor optical device for showing the planar shape of the ridge stripe structure portion. Also, FIG. 14A, FIG. 14B, FIG. 14C, and FIG. 14D show outlines of the ridge stripe structure portion, etc. having a flared structure.

Figure 10A:
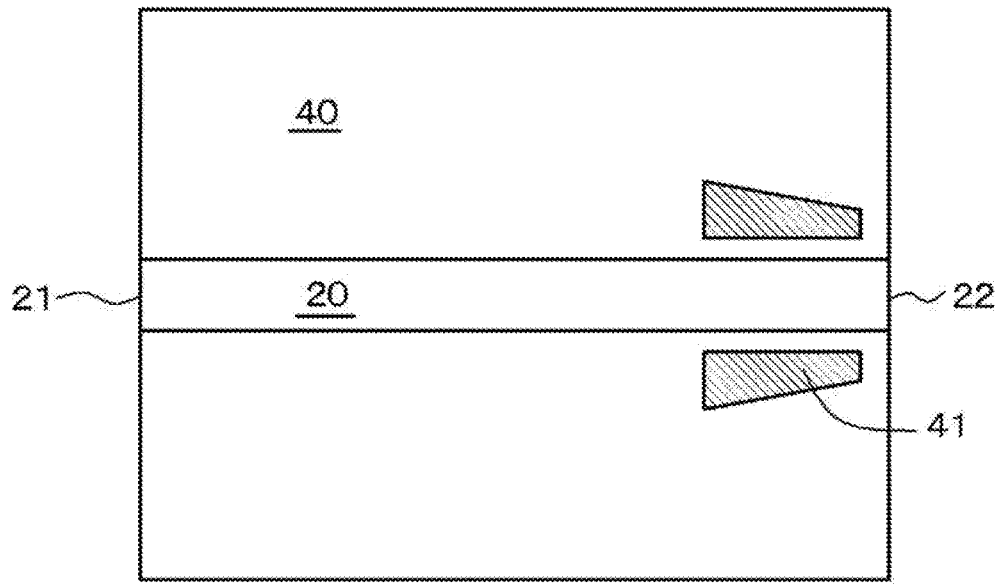
FIG. 10A and FIG. 10B are schematic arrangement diagrams of component elements of a semiconductor optical device for displaying a planar shape of a current regulation region.
Figure 10B:
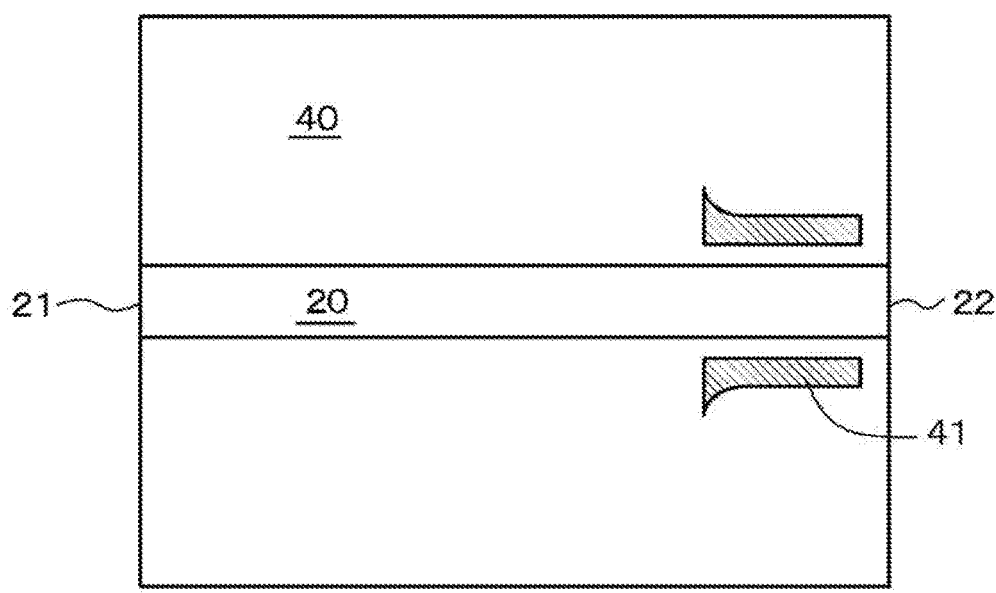
Figure 11A:
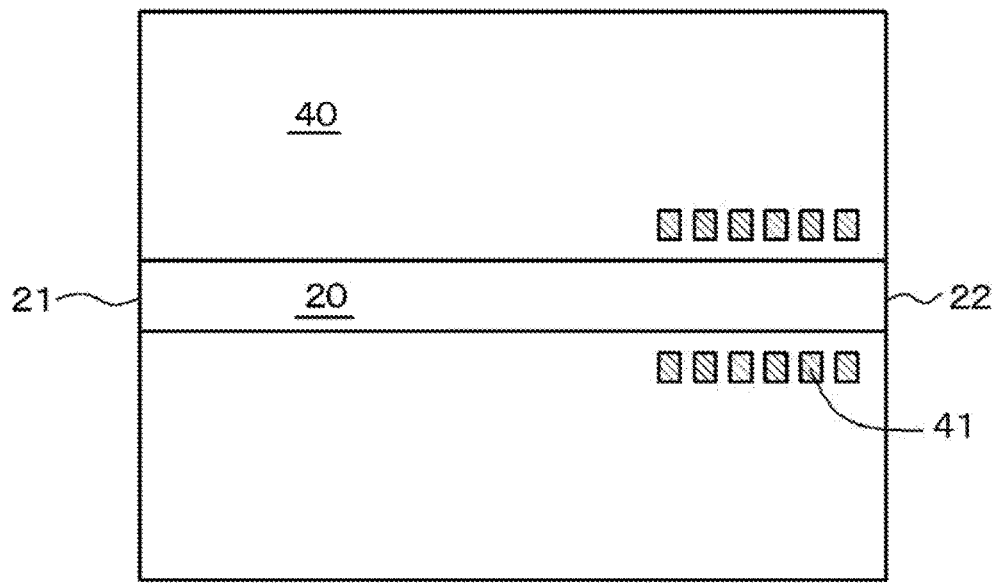
FIG. 11A and FIG. 11B are schematic arrangement diagrams of component elements of a semiconductor optical device for displaying a planar shape of a current regulation region.
Figure 11B:
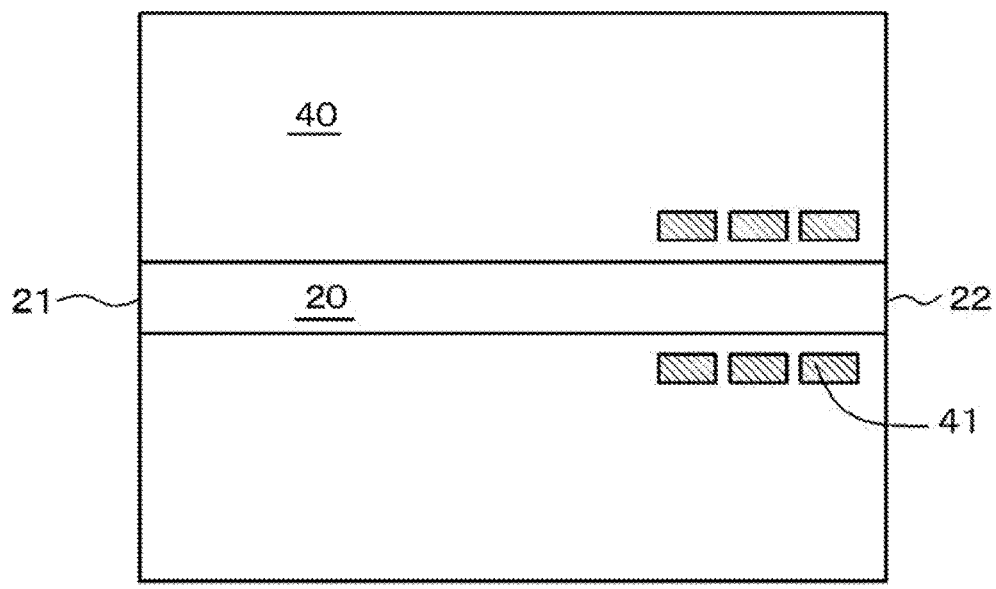
Figure 14A:
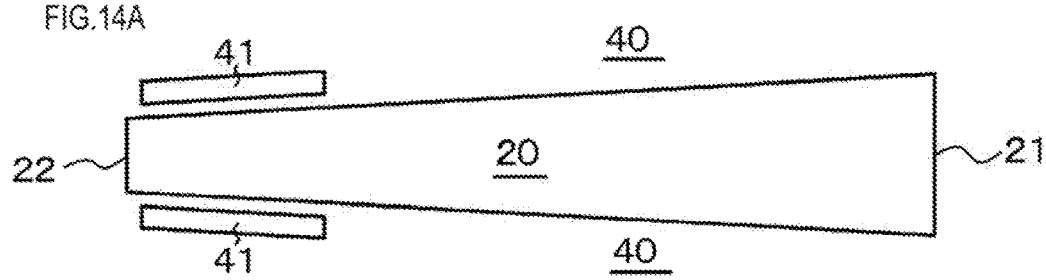
FIG. 14A, FIG. 14B, FIG. 14C, and FIG. 14D are views showing outlines of a ridge stripe structure portion or the like having a flared structure.
Figure 14B:
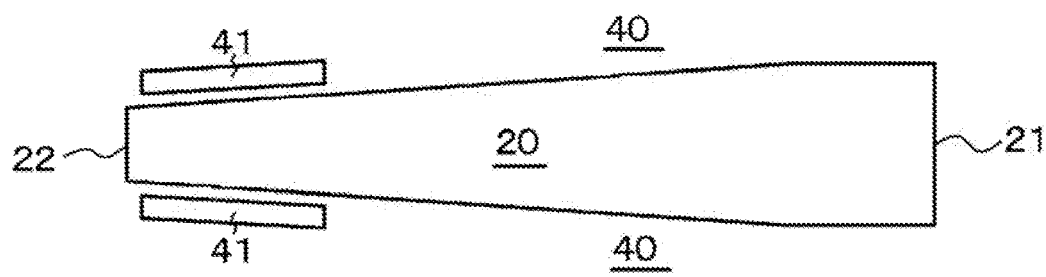
Figure 14C:
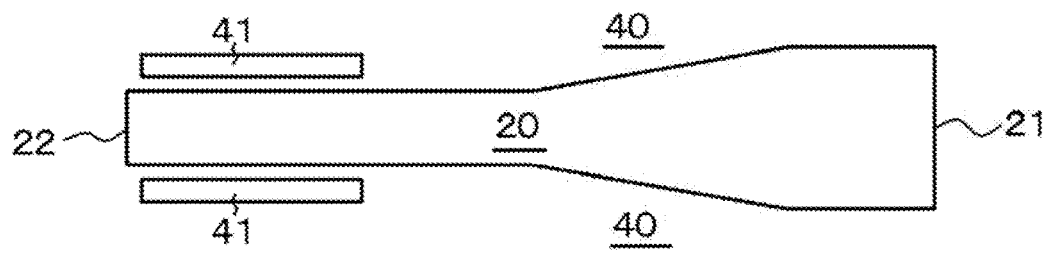
Figure 14D:
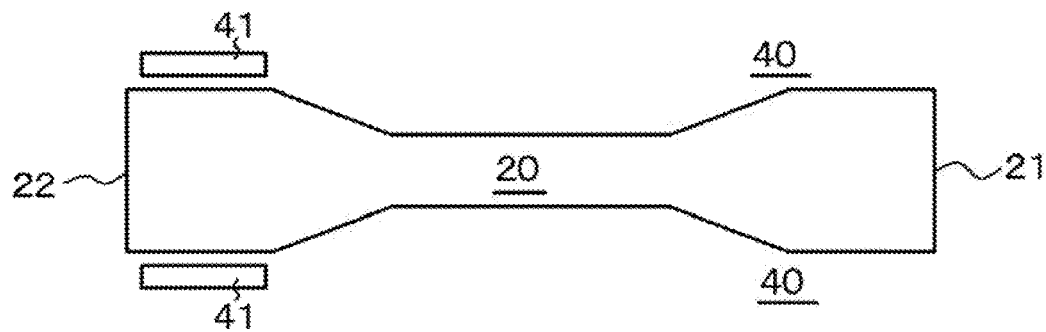

In other words, a planar shape of the current regulation region 41 can also be set to be a tapered shape (refer to FIG. 10A) or a flared shape (refer to FIG. 10B). Alternatively, the planar shape thereof can also be set to be a plurality of point-like (dot-like) shapes (refer to FIG. 11A) or a plurality of belt-like shapes (refer to FIG. 11B) arranged on a straight line (or a curved line) and can be configured to have a heat dissipation fin shape as shown in FIG. 12. Also, the ridge stripe structure portion 20 can be configured to have a shape which extends in a state in which a plurality of lines are combined as shown in FIG. 13A and can be configured to have a shape which extends in a curved shape as shown in FIG. 13B. A width of the ridge stripe structure portion 20 may be widest in the first end surface 21 and gradually narrowed toward the second end surface 22 as shown in FIG. 14A. Alternatively, the width of the ridge stripe structure portion 20 may be widest in the first end surface 21, constant toward the second end surface 22, and gradually narrowed toward the second end surface 22 as shown in FIG. 14B. Alternatively, the width of the ridge stripe structure portion 20 may be widest in the first end surface 21, constant toward the second end surface 22, gradually narrowed toward the second end surface 22, and constant toward the second end surface 22 as shown in FIG. 14C. Alternatively, the width of the ridge stripe structure portion 20 may be widest in the first end surface 21, constant toward the second end surface 22, gradually narrowed toward the second end surface 22, constant toward the second end surface 22, gradually widened toward the second end surface 22, and constant toward the second end surface 22 as shown in FIG. 14D. Also, an axis of the ridge stripe structure portion 20 may be perpendicular to the first end surface 21 and the second end surface 22 as disclosed in the examples and may intersect the first end surface 21 at a predetermined angle as shown in FIG. 13A and FIG. 13B. The axis of the ridge stripe structure portion 20 may intersect the second end surface 22 at a predetermined angle. Note that the ridge stripe structure portion 20 and the planar shape of the current regulation region 41 described above can be arbitrarily combined.

Additionally, the present technology may also be configured as below.

[A01]<<Semiconductor Optical Device: First Aspect>>

A semiconductor optical device including:

a ridge stripe structure portion in which a first compound semiconductor layer, an active layer made of a compound semiconductor, and a second compound semiconductor layer are stacked and which has a first end surface which emits light and a second end surface opposite to the first end surface; and a current regulation region provided to be adjacent to at least one of ridge stripe adjacent portions positioned at both sides of the ridge stripe structure portion, at the second end surface side, and to be away from the ridge stripe structure portion, wherein, when a distance from a bottom surface of the first compound semiconductor layer to a bottom surface of the current regulation region is $H_1$, a distance from the bottom surface of the first compound semiconductor layer to a top surface of the ridge stripe adjacent portion excluding the current regulation region is $H_2$, a thickness of the first compound semiconductor layer is $T_1$, a thickness of the active layer is $T_3$, and a thickness of the second compound semiconductor layer is $T_2$, the following expressions are satisfied:

$H_1 \leq T_1$, and $T_1+T_3 \leq H_2 \leq T_1+T_3+T_2$.

[A02]

A semiconductor optical device including:

a ridge stripe structure portion in which a first compound semiconductor layer, an active layer made of a compound semiconductor, and a second compound semiconductor layer are stacked and which has a first end surface which emits light and a second end surface opposite to the first end surface; and a current regulation region provided to be adjacent to at least one of ridge stripe adjacent portions positioned at both sides of the ridge stripe structure portion, at the second end surface side, and to be away from the ridge stripe structure portion, wherein a bottom surface of the current regulation region is under the active layer, and a top surface of the ridge stripe adjacent portion excluding the current regulation region is above the active layer.

[A03]

The semiconductor optical device according to [A01] or [A02], wherein, when a length of the ridge stripe structure portion is $L_0$ and a length of the current regulation region is $L_1$, the following expression is satisfied:

$0.1 \leq L_1/L_0 \leq 1.0$.

[A04]

The semiconductor optical device according to any one of [A01] to [A03], wherein, when a distance from an end of the first end surface side of the current regulation region to the second end surface is $DS_1$ and a length of the ridge stripe structure portion is $L_0$, the following expression is satisfied:

$DS_1/L_0 < 1.0$.

[A05]

The semiconductor optical device according to any one of [A01] to [A04], wherein the current regulation region prevents a leakage current from flowing from the ridge stripe structure portion.

[A06]<<Semiconductor Optical Device: Second Aspect>>

A semiconductor optical device including:

a ridge stripe structure portion in which a first compound semiconductor layer, an active layer made of a compound semiconductor, and a second compound semiconductor layer are stacked and which has a first end surface which emits light and a second end surface opposite to the first end surface; and a current regulation region provided to be adjacent to at least one of ridge stripe adjacent portions positioned at both sides of the ridge stripe structure portion, at the second end surface side, and to be away from the ridge stripe structure portion, wherein the current regulation region prevents a leakage current from flowing from the ridge stripe structure portion.

[A07]

The semiconductor optical device according to [A06], wherein, when a length of the ridge stripe structure portion is $L_0$ and a length of the current regulation region is $L_1$, the following expression is satisfied:

$0.1 \leq L_1/L_0 < 1.0$.

[A08]

The semiconductor optical device according to [A06] or [A07], wherein, when a distance from an end of the first end surface side of the current regulation region to the second end surface is $DS_1$ and a length of the ridge stripe structure portion is $L_0$, the following expression is satisfied:

$DS_1/L_0 < 1.0$.

[A09]

The semiconductor optical device according to any one of [A01] to [A08], wherein the current regulation region is constituted by a concave portion formed in the first compound semiconductor layer.

[A10]

The semiconductor optical device according to [A09], wherein an insulating material is embedded in the concave portion.

[A11]

The semiconductor optical device according to any one of [A01] to [A08], wherein the current regulation region is constituted by a layer of a compound semiconductor on which ion implantation has been performed.

[A12]

The semiconductor optical device according to any one of [A01] to [A08], wherein the current regulation region is constituted by an insulating layer.

[A13]

The semiconductor optical device according to any one of [A01] to [A08], wherein the current regulation region is configured to have a stacked structure of compound semiconductor layers which prevents a current from flowing from the second compound semiconductor layer to the first compound semiconductor layer via the current regulation region.

[A14]

The semiconductor optical device according to any one of [A01] to [A13], wherein the semiconductor optical device constitutes a super luminescent diode, a semiconductor laser element, or a semiconductor optical amplifier.

[B01]<<Display Device>>
A display device including:
the light emitting element according to any one of [A01] to [A14].

REFERENCE SIGNS LIST 10 substrate
11 buffer layer
12 concave portion provided in substrate
20 ridge stripe structure portion
21 first end surface
22 second end surface
30 stacked structure body
31 first compound semiconductor layer
31A region of first compound semiconductor layer at which current regulation region is to be formed
32 second compound semiconductor layer
33 active layer
34 first electrode
35 second electrode
36 insulating film
40 ridge stripe adjacent portion
41 current regulation region
42 concave portion
43 insulating material
44 insulating layer
45 layer made of compound semiconductor on which ion implantation has been performed
46A, 46B stacked structure of compound semiconductor layers
101R, 101G 101B semiconductor optical device
102R, 102G 102B dichroic prism
103 horizontal scanner
104 vertical scanner
105 irradiated surface
201R, 201G 201B image generating device
202R, 202G 202B semiconductor optical device (light source)
203R, 203G 203B GLV element
204 L-shaped prism
205 lens
206 spatial filter
207 scan mirror (galvano scanner)
208 screen

The invention claimed is:

1. A semiconductor optical device, comprising:
a ridge stripe structure portion comprising:
an first compound semiconductor layer;
an active layer of a compound semiconductor on the first compound semiconductor layer;
a second compound semiconductor layer on the active layer;
a first end surface configured to emit light; and
a second end surface opposite to the first end surface;
ridge stripe adjacent portions at both sides of the ridge stripe structure portion; and
a current regulation region at at least one of the ridge stripe adjacent portions,
wherein the current regulation region is closer to the second end surface than the first end surface,
wherein
a first distance from a bottom surface of the first compound semiconductor layer to a bottom surface of the current regulation region is $H_1$,
a second distance from the bottom surface of the first compound semiconductor layer to a top surface of the at least one of the ridge stripe adjacent portions excluding the current regulation region is $H_2$,
a first thickness of the first compound semiconductor layer is $T_1$,
a second thickness of the active layer is $T_3$, and
a third thickness of the second compound semiconductor layer is $T_2$, and
wherein following expressions are satisfied:

$H_1 \leq T_1$, and $T_1 + T_3 \leq H_2 \leq T_1 + T_3 + T_2$.

2. The semiconductor optical device according to claim 1, wherein a first length of the ridge stripe structure portion is $L_0$ and a second length of the current regulation region is $L_1$, and
wherein following expression is satisfied:

$0.1 \leq L_1/L_0 \leq 1.0$.

3. The semiconductor optical device according to claim 1, wherein a third distance from an end of the current regulation region towards the first end surface to the second end surface is $DS_1$ and a length of the ridge stripe structure portion is $L_0$, and
wherein following expression is satisfied:

$DS_1/L_0 < 1.0$.

4. The semiconductor optical device according to claim 1, wherein the current regulation region is configured to prevent a leakage current from flowing from the ridge stripe structure portion.

5. A semiconductor optical device, comprising:
a ridge stripe structure portion comprising:
a first compound semiconductor layer;
an active layer of a compound semiconductor on the first compound semiconductor layer;
a second compound semiconductor layer on the active layer;
a first end surface configured to emit light; and
a second end surface opposite to the first end surface;
ridge stripe adjacent portions at both sides of the ridge stripe structure portion; and
a current regulation region at at least one of the ridge stripe adjacent portions,
wherein the current regulation region is closer to the second end surface than the first end surface, and
wherein the current regulation region is configured to prevent a leakage current from flowing from the ridge stripe structure portion.

6. The semiconductor optical device according to claim 5, wherein a first length of the ridge stripe structure portion is $L_0$ and a second length of the current regulation region is $L_1$, and
wherein following expression is satisfied:

$0.1 \leq L_1/L_0 < 1.0$.

7. The semiconductor optical device according to claim 5, wherein a distance from an end of the current regulation region towards the first end surface to the second end surface is $DS_1$ and a length of the ridge stripe structure portion is $L_0$, and
wherein following expression is satisfied:

$DS_1/L_0 < 1.0$.

8. The semiconductor optical device according to claim 1, wherein the current regulation region comprises a concave portion in the first compound semiconductor layer.

9. The semiconductor optical device according to claim 8, wherein an insulating material is embedded in the concave portion.

10. The semiconductor optical device according to claim 1, wherein the current regulation region comprises an ion implanted layer of the compound semiconductor.

11. The semiconductor optical device according to claim 1, wherein the current regulation region comprises an insulating layer.

12. The semiconductor optical device according to claim 1, wherein the current regulation region comprises a structure of compound semiconductor layers, wherein the structure of compound semiconductor layers prevent a current from flowing from the second compound semiconductor layer to the first compound semiconductor layer via the current regulation region.

13. The semiconductor optical device according to claim 1, wherein the semiconductor optical device is one of a super luminescent diode, a semiconductor laser element, or a semiconductor optical amplifier.

* * * * *